United States Patent
Shinozaki

(10) Patent No.: US 9,894,302 B2
(45) Date of Patent: *Feb. 13, 2018

(54) IMAGING APPARATUS, IMAGE PROCESSING METHOD, AND PROGRAM

(71) Applicant: Sony Semiconductor Solutions Corporation, Kanagawa (JP)

(72) Inventor: Hirotaka Shinozaki, Tokyo (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/354,144

(22) Filed: Nov. 17, 2016

(65) Prior Publication Data

US 2017/0070694 A1    Mar. 9, 2017

Related U.S. Application Data

(63) Continuation of application No. 14/435,806, filed as application No. PCT/JP2013/075639 on Sep. 24, 2013, now Pat. No. 9,549,157.

(30) Foreign Application Priority Data

Oct. 23, 2012 (JP) ................................. 2012-234004

(51) Int. Cl.
*H04N 5/367* (2011.01)
*H01L 27/146* (2006.01)
(Continued)

(52) U.S. Cl.
CPC ............. *H04N 5/3675* (2013.01); *G02B 5/20* (2013.01); *G02B 13/0015* (2013.01);
(Continued)

(58) Field of Classification Search
None
See application file for complete search history.

(56) References Cited

U.S. PATENT DOCUMENTS 6,683,643 B1    1/2004    Takayama et al.
7,061,533 B1    6/2006    Urushiya
(Continued)

FOREIGN PATENT DOCUMENTS

JP    06-006685 A    1/1994
JP    10-322603 A    12/1998
(Continued)

OTHER PUBLICATIONS

U.S. Appl. No. 14/435,806, filed Apr. 15, 2015, Shinozaki.

*Primary Examiner* — James Hannett
(74) *Attorney, Agent, or Firm* — Wolf, Greenfield & Sacks, P.C.

(57) ABSTRACT

A defective pixel of an imaging device is detected. An output pixel value of the defective pixel is corrected to generate an output image. An imaging device, and a signal processing unit for analyzing an output signal from the imaging device and detecting a defective pixel are included. The imaging device receives incident light via, for example, a microlens placed in front of a pixel, inputs the same subject light on a local area basis including a plurality of pixels of the imaging device, and acquires an image signal lower than a pixel resolving power corresponding to the pixel density of the imaging device. The signal processing unit compares the pixel values of the same color pixels included in a local area on a local area basis including a cluster of the plurality of pixels of the imaging device, detects the defective pixel based on the comparison result, and corrects and outputs a pixel value of a pixel determined to be a defective pixel.

20 Claims, 18 Drawing Sheets

(51) Int. Cl.
  *G02B 5/20* (2006.01)
  *G02B 13/00* (2006.01)
  *H04N 5/225* (2006.01)
  *H04N 5/232* (2006.01)
  *H04N 5/357* (2011.01)
  *H04N 9/04* (2006.01)
  *H04N 5/217* (2011.01)
  *H04N 5/345* (2011.01)

(52) U.S. Cl.
  CPC .. *H01L 27/14621* (2013.01); *H01L 27/14627* (2013.01); *H04N 5/2176* (2013.01); *H04N 5/2254* (2013.01); *H04N 5/23241* (2013.01); *H04N 5/345* (2013.01); *H04N 5/357* (2013.01); *H04N 5/367* (2013.01); *H04N 9/045* (2013.01); *H04N 2209/045* (2013.01)

(56) References Cited

U.S. PATENT DOCUMENTS

| | | | |
|---|---|---|---|
| 9,100,635 B2* | 8/2015 | Duparre | H04N 17/002 |
| 9,549,157 B2* | 1/2017 | Shinozaki | H04N 5/2176 |
| 2004/0046881 A1 | 3/2004 | Utagawa | |
| 2007/0091187 A1 | 4/2007 | Lin | |
| 2008/0298716 A1* | 12/2008 | Yamagata | H04N 5/3675 |
| | | | 382/275 |
| 2010/0141812 A1 | 6/2010 | Hirota | |
| 2011/0102624 A1 | 5/2011 | Hashizume | |
| 2011/0102649 A1 | 5/2011 | Hashizume | |
| 2011/0199458 A1 | 8/2011 | Hayasaka et al. | |
| 2013/0070060 A1* | 3/2013 | Chatterjee | H04N 5/2258 |
| | | | 348/47 |
| 2015/0070562 A1* | 3/2015 | Nayar | H01L 27/14621 |
| | | | 348/336 |
| 2015/0288935 A1 | 10/2015 | Shinozaki | |

FOREIGN PATENT DOCUMENTS

| | | |
|---|---|---|
| JP | 11-103423 A | 4/1999 |
| JP | 2000-295532 A | 10/2000 |
| JP | 2005-328134 A | 11/2005 |
| JP | 2007-019959 A | 1/2007 |
| JP | 2007-143131 A | 6/2007 |
| JP | 2008-154276 A | 7/2008 |
| JP | 2008-258909 A | 10/2008 |
| JP | 2009-005390 A | 1/2009 |
| JP | 2009-105872 A | 5/2009 |
| JP | 2009-188894 A | 8/2009 |
| JP | 2010-136225 A | 6/2010 |
| JP | 2011-097542 A | 5/2011 |
| JP | 2011-120202 A | 6/2011 |
| JP | 2011-171858 A | 9/2011 |

* cited by examiner

FIG. 1
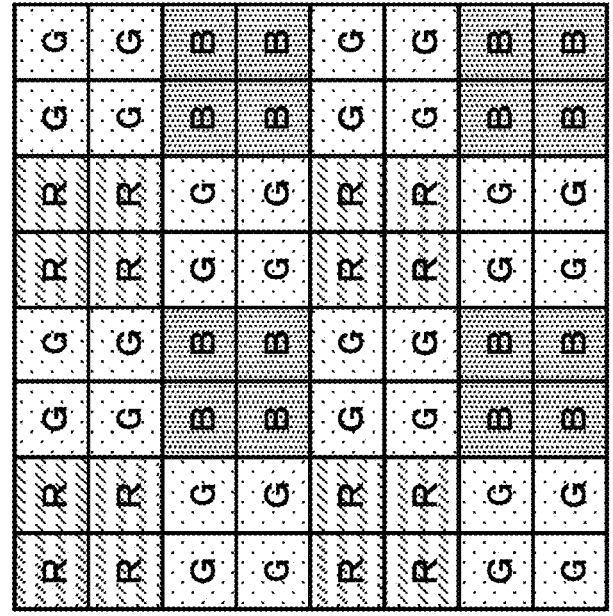
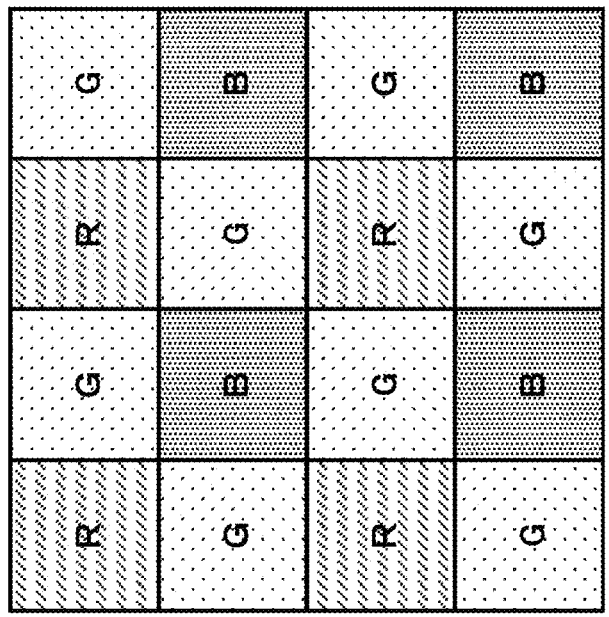

FIG. 3
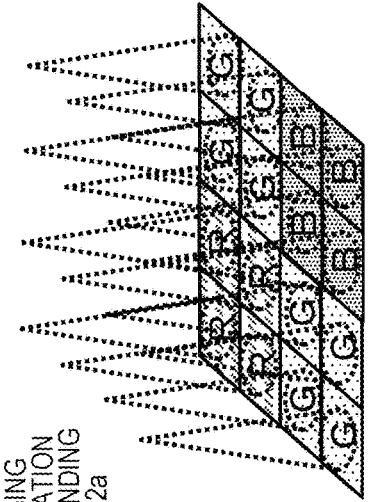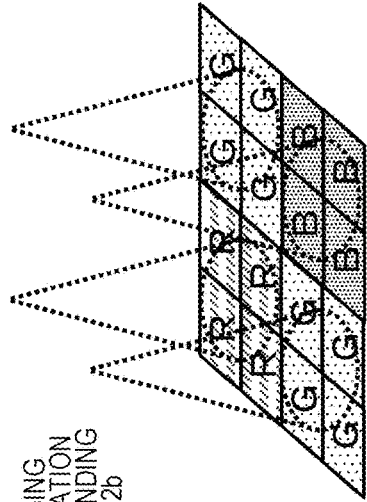
(2) FOUR-WAY SPLIT BAYER RGB ARRANGEMENT
(2a) IMAGING CONFIGURATION CORRESPONDING TO FIG. 2a
(2b) IMAGING CONFIGURATION CORRESPONDING TO FIG. 2b
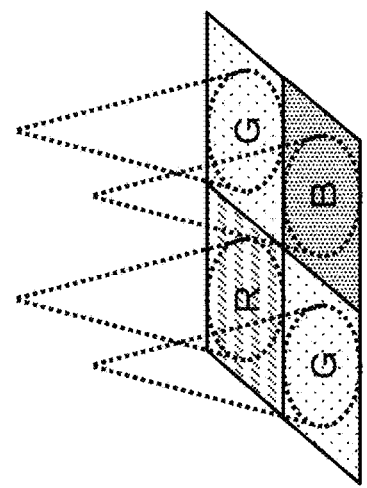
(1) BAYER (Bayer) ARRANGEMENT FIG. 5
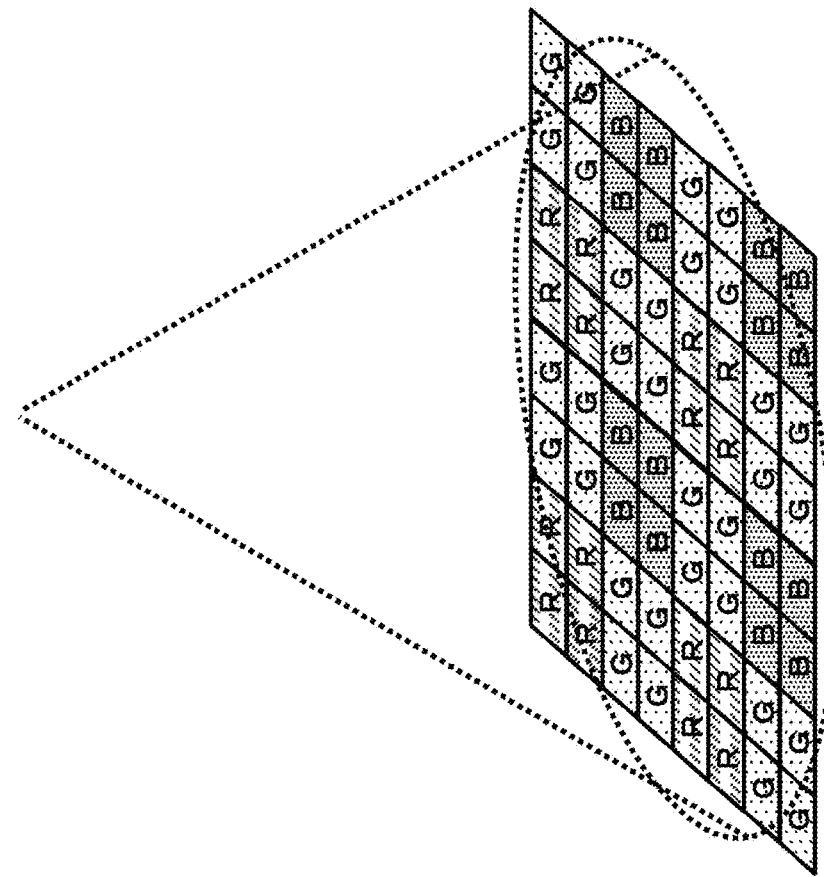
(c) DIFFUSION EXAMPLE FOR 8×8 PIXELS
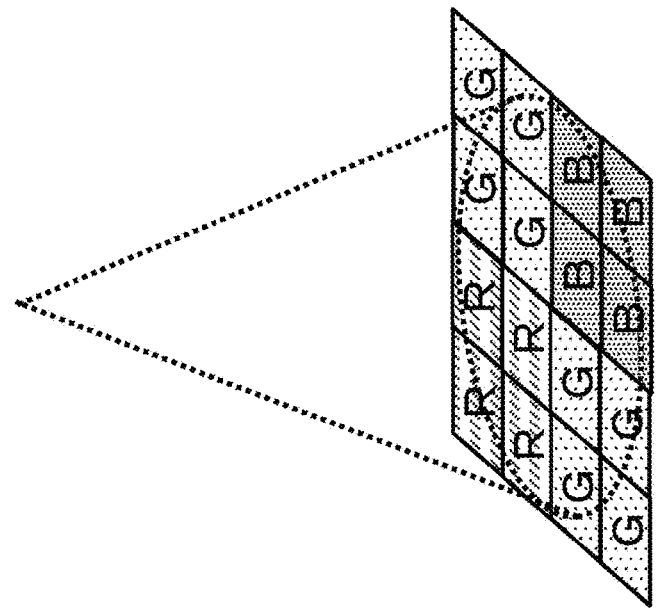
(b) DIFFUSION EXAMPLE FOR 4×4 PIXELS

FIG. 15

(A) FOUR-WAY SPLIT BAYER RGB ARRANGEMENT (B) FOUR-WAY SPLIT WRGB ARRANGEMENT

IMAGING APPARATUS, IMAGE PROCESSING METHOD, AND PROGRAM

CROSS-REFERENCE TO RELATED APPLICATIONS

This application is a continuation of and claims the benefit under 35 U.S.C. § 120 of U.S. patent application Ser. No. 14/435,806, titled "IMAGING APPARATUS, IMAGE PROCESSING METHOD, AND PROGRAM," filed on Apr. 15, 2015, which is a National Stage of International Application No. PCT/JP2013/075639, filed in the Japanese Patent Office as a Receiving Office on Sep. 24, 2013, which claims priority to Japanese Patent Application Number JP 2012-234004, filed in the Japanese Patent Office on Oct. 23, 2012, each of which is hereby incorporated by reference in its entirety.

TECHNICAL FIELD

The present disclosure relates to an imaging apparatus, an image processing method, and a program, and especially relates to an imaging apparatus, image processing method, and program that detect a defective pixel of an imaging device.

BACKGROUND ART

An imaging device mounted in a digital camera, video camera, or the like includes a CMOS (Complementary Metal Oxide Semiconductor) image sensor, or a CCD (Charge Coupled Device) image sensor, which is formed on a semiconductor substrate. A defective pixel may occur in such an imaging device due to a local crystal defect on the semiconductor substrate.

Such a defective pixel ends up outputting a specific pixel value that is not dependent on the amount of incident light. Therefore, if the defective pixel exists in the imaging device, a captured image including an error pixel value is output so that the image quality deteriorates.

Many of the known imaging apparatuses such as video cameras and digital cameras have the following countermeasure configuration to prevent an error based on such a defective pixel. In other words, address data indicating the location of a defective pixel in a solid-state imaging device is prestored in a memory device such as nonvolatile memory in the manufacturing stage. A signal output from the defective pixel is corrected and output based on the address data indicating the defective pixel stored in the memory device upon image capture. This is the countermeasure.

For example, in a case where a CMOS image sensor is mounted in an imaging apparatus, an output signal of each pixel of the CMOS image sensor and output signals of neighboring pixels of the pixel to be examined are compared in the manufacturing stage in a state where a lens of the imaging apparatus is shielded from light and light does not enter the CMOS image sensor. If the difference between these output signal values exceeds a predetermined threshold value, the pixel that has output this specific signal is determined to be a defective pixel.

Furthermore, address data indicating the location of the pixel determined to be a defective pixel is stored in nonvolatile memory. When the defective pixel detection ends, the CMOS image sensor and the nonvolatile memory in which the address data of the defective pixel is stored are integrated in the imaging apparatus for shipment.

When a user captures an image using the imaging apparatus, an output signal of the defective pixel included in an output video signal from the CMOS image sensor is corrected, using output signals of the pixels in the vicinity of the defective pixel, based on the address data of the defective pixel of the CMOS image sensor stored in the nonvolatile memory. An image having the corrected pixel value signal is then output as an output image.

Such a method is used as the known countermeasure against defective pixels in many cases.

However, the process is effective strictly and only for a defective pixel found in the manufacturing stage of the imaging device. There is a problem that the above countermeasure cannot deal with a defective pixel of the imaging device occurring due to aging after the shipment of the imaging apparatus.

In order to deal with such a problem, for example, Patent Document 1 (JP 06-6685 A) discloses a defect correction apparatus that, upon the turning-on of the power to an imaging apparatus, closes an aperture of a lens mounted in the imaging apparatus to enter a light-shielding state, detects a defective pixel with an imaging output signal of a solid-state imaging device, records and holds defect data based on a detection signal from the defective pixel, and corrects the defective pixel, using the latest defect data upon image capture.

However, such a defect correction configuration needs to store address data of the defective pixel, and the like in memory, and memory capacity therefor needs to be secured. Accordingly, there is a problem to result in an increase in the cost of the apparatus. Moreover, there is also a problem that the number of correctable defective pixels tends to depend on the storage capacity of the memory in which the address data of the defective pixels is stored.

Furthermore, for example, Patent Document 2 (JP 2008-154276 A) and Patent Document 3 (JP 2009-105872 A) disclose configurations that also enable the detection and correction of a defective pixel that occurs after shipment without mounting a memory in which the locations of defective pixels are stored.

Patent Document 2 discloses the configuration that verifies, for example, a texture direction around a pixel of interest selected from a captured image and detects and corrects a defect with reference to the texture direction. The detection accuracy and the correction accuracy are improved by the process with reference to the texture direction.

However, there is a problem with the configuration that the performance in the detection and correction of a defect is decreased in an image area where the texture direction around a pixel of interest cannot be obtained accurately, such as a flat area. Moreover, there is also a problem that the calculation cost and the circuit size are increased to determine the texture direction accurately.

Moreover, Patent Document 3 discloses the configuration that uses the standard deviation value of neighboring pixels for the detection of a defective pixel based on a captured image. However, the value of the standard deviation is also increased at an edge of the image. Accordingly, there is a problem that such a detection error as that determines the edge area to be a defective pixel occurs, and a wrong pixel value correction is made to contrarily deteriorate the image quality.

CITATION LIST

Patent Document

Patent Document 1: JP 06-6685 A
Patent Document 2: JP 2008-154276 A
Patent Document 3: JP 2009-105872 A

SUMMARY OF THE INVENTION

Problems to be Solved by the Invention

The present disclosure has been made considering, for example, the above problems, and an object thereof is to provide an imaging apparatus, image processing method, and program that highly accurately detect a defective pixel existing in an imaging device, and generate an output image of high quality where the output pixel value of the defective pixel has been corrected.

Solutions to Problems

A first aspect of the present disclosure is an imaging apparatus including:

an imaging device; and a signal processing unit for analyzing an output signal from the imaging device and detecting a defective pixel included in the imaging device, wherein the imaging device inputs the same subject light on a local area basis including a plurality of pixels of the imaging device, acquires an image signal lower than a pixel resolving power corresponding to the pixel density of the imaging device, and outputs the image signal to the signal processing unit, and the signal processing unit compares pixel values of the same color pixels included in the local area on a local area basis including a cluster of the plurality of pixels of the imaging device, and detects a defective pixel based on the comparison result.

Further, in an embodiment of the imaging apparatus of the present disclosure, the signal processing unit executes a process of determining a pixel of interest to be a defective pixel when variations in pixel values of the same color pixels included in the local area is large, and when a difference between an average of intermediate pixel values except maximum and minimum pixel values of the same color pixels included in the local area, and a pixel value of the pixel of interest is large.

Further, in an embodiment of the imaging apparatus of the present disclosure, the signal processing unit executes a process of determining a pixel of interest to be a defective pixel when a standard deviation of pixel values of the same color pixels included in the local area is larger than a preset threshold value (TH1), and when a difference absolute value between an average of intermediate pixel values except maximum and minimum pixel values of the same color pixels included in the local area, and a pixel value of the pixel of interest is larger than a preset threshold value (TH2).

Further, in an embodiment of the imaging apparatus of the present disclosure, the imaging device includes a photoelectric conversion unit having pixels arranged in a two-dimensional array form, and a microlens placed on an imaging lens side being on a front side of the photoelectric conversion unit, and has a configuration where incident light via an imaging lens is diffused via the microlens, and the same subject light is received on the local area basis including the plurality of pixels of the imaging device.

Further, in an embodiment of the imaging apparatus of the present disclosure, the signal processing unit has a configuration where an image on a specific pixel area basis is reconstructed from an image acquired by the imaging device including the microlens and accordingly a specific point-of-view image is generated.

Further, in an embodiment of the imaging apparatus of the present disclosure, the imaging device has a pixel arrangement where each pixel of a Bayer arrangement including RGB pixels or an arrangement including RGBW pixels is split into four, 2×2 pixels, of the same color.

Further, in an embodiment of the imaging apparatus of the present disclosure, the imaging device inputs the same subject light on a local area basis including 2×2 same color pixels of the imaging device, acquires an image signal lower than a pixel resolving power corresponding to the pixel density of the imaging device, and outputs the image signal to the signal processing unit.

Further, in an embodiment of the imaging apparatus of the present disclosure, the imaging device inputs the same subject light on a local area basis including 4×4 or 8×8 pixels of the imaging device, acquires an image signal lower than a pixel resolving power corresponding to the pixel density of the imaging device, and outputs the image signal to the signal processing unit.

Further, in an embodiment of the imaging apparatus of the present disclosure, the imaging device lets in subject light via a low-resolution imaging lens with a low optical resolving power for forming an optical image with a resolving power lower than a pixel resolving power corresponding to the pixel density of the imaging device and accordingly acquires an image signal lower than the pixel resolving power corresponding to the pixel density of the imaging device, and outputs the image signal to the signal processing unit.

Further, in an embodiment of the imaging apparatus of the present disclosure, the imaging device includes a photoelectric conversion unit having pixels arranged in a two-dimensional array form, and an optical low-pass filter placed on an imaging lens side being on a front side of the photoelectric conversion unit, and has a configuration where incident light via an imaging lens is diffused via the optical low-pass filter, and the same subject light is received on the local area basis including the plurality of pixels of the imaging device.

Further, in an embodiment of the imaging apparatus of the present disclosure, the signal processing unit includes a defective pixel correction unit for executing a pixel value correction on a defective pixel, and the defective pixel correction unit calculates a corrected pixel value of the defective pixel taking, as reference pixels, intermediate pixel values except maximum and minimum pixel values of the pixels of the same color as the defective pixel included in the same local area as the defective pixel.

Further, in an embodiment of the imaging apparatus of the present disclosure, the defective pixel correction unit sets a maximum pixel value of the intermediate pixel values as the corrected pixel value of the defective pixel when the defective pixel has the maximum pixel value among the same color pixels in the local area including the defective pixel, and sets a minimum pixel value of the intermediate pixel values as the corrected pixel value of the defective pixel when the defective pixel has the minimum pixel value among the same color pixels in the local area including the defective pixel.

Further, a second aspect of the present disclosure is an image processing method executed in an imaging apparatus, executing:

a step of, in an imaging device, inputting the same subject light on a local area basis including a plurality of pixels of the imaging device, acquiring an image signal lower than a pixel resolving power corresponding to the pixel density of the imaging device, and outputting the image signal to the signal processing unit, and a signal processing step of, in the signal processing unit, analyzing an output signal from the imaging device, and detecting a defective pixel included in the imaging device, wherein in the signal processing step, the signal processing unit compares pixel values of the same color pixels included in the local area on a local area basis including a cluster of the plurality of pixels of the imaging device, and detects the defective pixel based on the comparison result.

Further, a third aspect of the present disclosure is a program to cause an imaging apparatus to execute image processing, including:

a step of causing an imaging device to input the same subject light on a local area basis including a plurality of pixels of the imaging device, acquire an image signal lower than a pixel resolving power corresponding to the pixel density of the imaging device, and output the image signal to the signal processing unit, and a signal processing step of causing the signal processing unit to analyze an output signal from the imaging device, and detect a defective pixel included in the imaging device, wherein the signal processing step includes comparing pixel values of the same color pixels included in the local area on a local area basis including a cluster of the plurality of pixels of the imaging device, and detecting the defective pixel based on the comparison result.

The program of the present disclosure is, for example, a program that can be provided by a storage medium or communication medium that is provided in a computer readable form, to an information processing apparatus or computer system that can execute various program codes. Such a program is provided in the computer readable form. Accordingly, processes in accordance with the program can be achieved on the information processing apparatus or computer system.

Still other objects, features, and advantages of the present disclosure will be clear from a more detailed description based on examples of the present disclosure described below and the accompanying drawings. The system in the present description is a logically assembled configuration of a plurality of devices, and is not limited to one having devices of configurations in the same housing.

Effects of the Invention

According to a configuration of one example of the present disclosure, a defective pixel of an imaging device is detected. An output pixel value of the defective pixel is corrected to generate an output image.

Specifically, an imaging apparatus includes an imaging device, and a signal processing unit that analyzes an output signal from the imaging device and detects a defective pixel. The imaging device receives incident light via, for example, a microlens placed in front of a pixel, inputs the same subject light on a local area basis including a plurality of pixels of the imaging device, and acquires an image signal lower than a pixel resolving power corresponding to the pixel density of the imaging device. The signal processing unit compares the pixel values of the same color pixels included in the local area on a local area basis including a cluster of the plurality of pixels of the imaging device, detects a defective pixel based on the comparison result, and corrects and outputs a pixel value of the pixel determined to be a defective pixel.

These processes enable highly accurate detection of a defective pixel existing in the imaging device. Accordingly, it is possible to generate a high quality output image where an output pixel value of the defective pixel has been corrected.

BRIEF DESCRIPTION OF DRAWINGS

FIGS. 1(1) and 1(2) are diagrams explaining pixel configurations of a Bayer arrangement and a four-way split Bayer arrangement.

FIGS. 3(1), 3(2a), and 3(2b) are diagrams explaining a captured image of the imaging apparatus of the present disclosure.

FIGS. 5(b) and 5(c) are diagrams explaining a captured image of the imaging apparatus of the present disclosure.

FIGS. 15(A) and 15(B) are diagrams explaining examples of the pixel arrangement of the imaging device of the imaging apparatus of the present disclosure.

MODE FOR CARRYING OUT THE INVENTION

Figure 2:
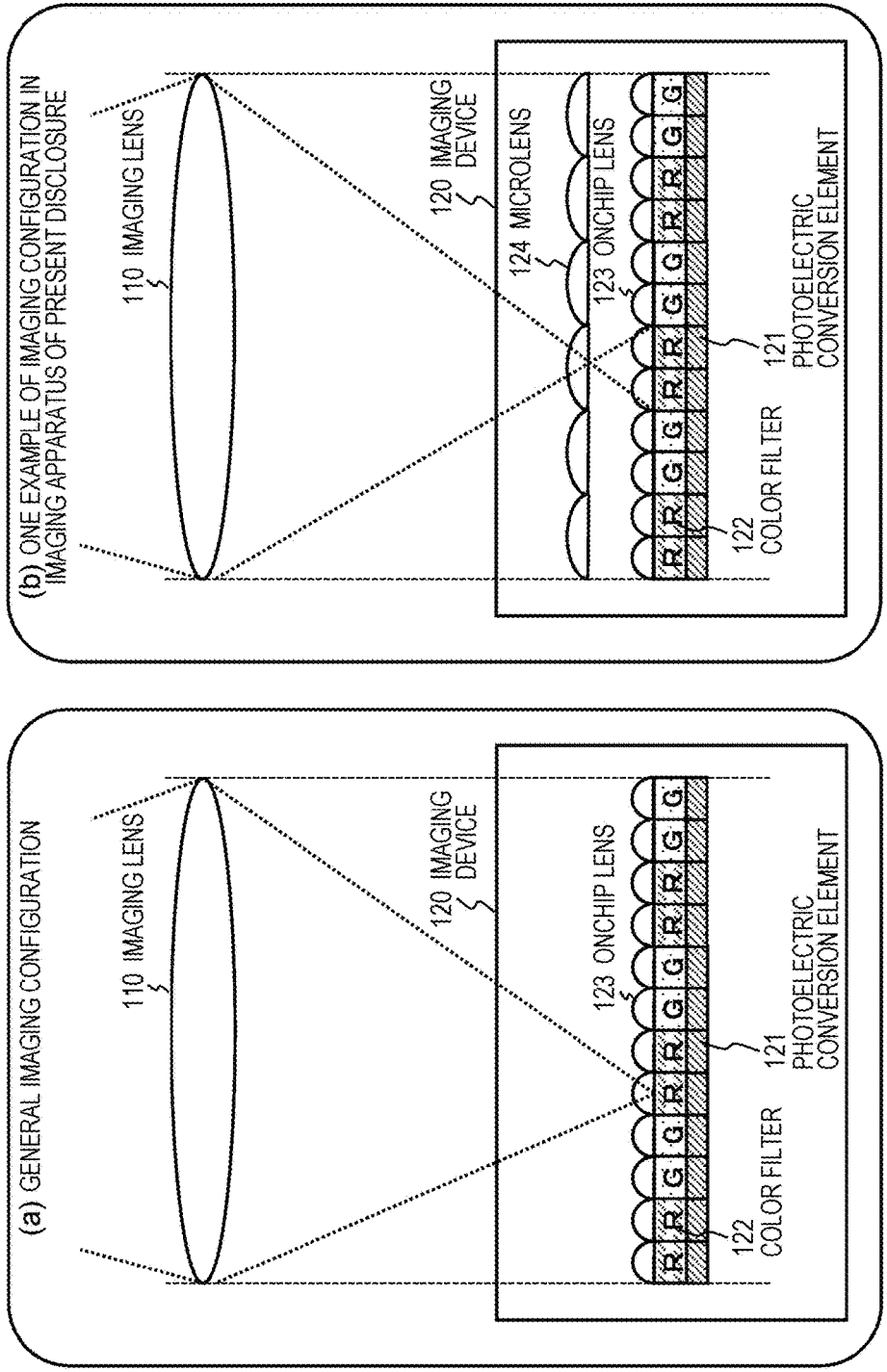
FIGS. 2(a) and 2(b) are diagrams explaining a general imaging configuration and a configuration of an imaging device of an imaging apparatus of the present disclosure.

Hereinafter, the details of an imaging apparatus, an image processing method, and a program of the present disclosure are described with reference to the drawings. The descriptions are given in accordance with the following items:

1. Correspondence between an Imaging Device Configuration and Incident Light in the Imaging Apparatus of the Present Disclosure;
2. Configuration and Process of the Imaging Apparatus of the Present Disclosure;
3. Configuration and Process of the Defect Detection and Correction Unit;
 3-1. Details of the Configuration and Process of the Defective Pixel Detection Unit;
 3-2. Details of the Configuration and Process of the Defective Pixel Correction Unit;
4. Example Using a Low-resolution Lens for the Imaging Lens;
5. Example Using an Optical Low-pass Filter;
6. Variations in the Pixel Arrangement;
7. Example in which the Arrangement Conversion Unit Is Replaced with the Demosaicing Processing Unit,
8. Example Including a Specific Point-of-View Image Generation Unit; and
9. Summary of the Configuration of the Present Disclosure.

[1. Correspondence Between an Imaging Device Configuration and Incident Light in the Imaging Apparatus of the Present Disclosure]

Firstly, a description is given of the correspondence between an imaging device configuration and incident light in the imaging apparatus of the present disclosure. FIGS. 1(1) and 1(2) illustrate the following two examples of the pixel arrangement of an imaging device (image sensor).

(1) A Bayer RGB Arrangement
(2) A Four-way split Bayer RGB arrangement

The Bayer RGB arrangement illustrated in FIG. 1(1) is the pixel arrangement of an imaging device (image sensor) used in current digital cameras, video cameras, and the like in many cases, and has a configuration where each pixel selectively receives one of R (red), G (green), and B (blue) lights. Specifically, a color filter that selectively transmits one of the RGB wavelength lights is attached in front of a photoelectric conversion element to selectively receive one of the RGB wavelength lights in each pixel of the imaging device.

Each of the RGB pixels stores charge in accordance with the light receiving amount, on a pixel basis. Each pixel outputs an electrical signal, in other words, a pixel value in accordance with the stored charge.

On the other hand, the four-way split Bayer RGB arrangement illustrated in FIG. 1(2) is an example of the configuration of an imaging device (image sensor) applied in the imaging apparatus (the imaging apparatus) of the present disclosure. The four-way split Bayer RGB arrangement illustrated in FIG. 1(2) includes a pixel arrangement where each of the RGB pixels of the Bayer RGB arrangement illustrated in FIG. 1(1) is split into four.

In other words, one R pixel of the Bayer RGB arrangement illustrated in FIG. 1(1) is split into four to make it four R pixels. One G pixel is split into four to make it four G pixels. One B pixel is split into four to make it four B pixels.

As the entire imaging device, the number of pixels of the four-way split Bayer RGB arrangement illustrated in (2) has the number of pixels four times as many as the number of pixels of the Bayer RGB arrangement illustrated in (1).

In recent years, the pixel density of the imaging device can be dramatically increased with the progress of the semiconductor technology. The imaging device having the dramatically increased number of pixels can be created. Accordingly, such an imaging device with a high pixel density as illustrated in FIG. 1(2) can be manufactured.

The imaging device of the four-way split Bayer RGB arrangement illustrated in FIG. 1(2) has a four-times resolving power as compared to the imaging device of the Bayer RGB arrangement illustrated in FIG. 1(1).

However, in the imaging apparatus of the present disclosure, the imaging device of the four-way split Bayer RGB arrangement illustrated in FIG. 1(2) is applied. An image is captured which has a resolving power that has been decreased on purpose to a resolving power level of the imaging device of the Bayer RGB arrangement illustrated in FIG. 1(1). The highly accurate detection of a defective pixel is achieved using the captured image with the decreased resolving power level.

An example of an imaging configuration in the imaging apparatus of the present disclosure is described with reference to FIGS. 2(a) and 2(b).

FIGS. 2(a) and 2(b) illustrate the following two imaging configurations:

(a) A general imaging configuration; and
(b) One example of an imaging configuration of the imaging apparatus of the present disclosure.

If image capture making use of the resolving power of the imaging device is performed, an image is generally captured by performing focus control on incident light via an imaging lens 110 in such a manner as to form a subject image being an image capture target on each pixel of an imaging device 120, as illustrated in FIG. 2(a).

Each pixel of the imaging device has a configuration where a photoelectric conversion element (photodiode) 121, a color filter 122, and an onchip lens 123 are stacked. Each photoelectric conversion element 121 stores charge in accordance with the intensity of a wavelength light transmitted through the color filter 122 in front of the photoelectric conversion element 121, in other words, a wavelength light corresponding to one of R, G, and B, and outputs a signal (pixel value) proportional to the stored charge.

The imaging process illustrated in FIG. 2(a) enables the imaging of an image of a different subject area depending on the pixel of the imaging device. Accordingly, an image with a resolving power in accordance with the pixel density of the imaging device can be captured.

In contrast, in the imaging configuration according to one example of the present disclosure illustrated in FIG. 2(b), the imaging device 120 has a different configuration from that of the imaging device illustrated in FIG. 2(a). In other words, the microlens 124 is included on the front side of, in other words, on the imaging lens 110 side, of the imaging device 120.

The microlens 124 performs the process of diffusing the incident light entering via the imaging lens 110. With the diffusion process, an image light that should be condensed onto one pixel illustrated in FIG. 2(a) is diffused over and enters a pixel area of a plurality of pixels, for example, 2×2=4 pixels, of the photoelectric conversion elements 121.

With such an imaging process, a captured image acquired by the imaging device 120 becomes an image with low resolution that does not have resolution corresponding to the resolving power of the imaging device. However, it becomes possible to detect a defective pixel with high accuracy. The process is described later.

A more specific captured image of the imaging configuration illustrated in FIG. 2(b) is described with reference to FIGS. 3(1), 3(2a), and 3(2b). FIGS. 3(1), 3(2a), and 3(2b) are diagrams schematically illustrating imaging configurations for the two imaging device arrangements described above with reference to FIGS. 1(1) and 1(2). FIGS. 3(1), 3(2a), and 3(2b) illustrate the following imaging configuration examples:

(1) An imaging configuration for the known Bayer arrangement;

(2) As examples of the imaging configuration of the four-way split Bayer arrangement;

(2a) An imaging configuration with a setting to form a subject image on each pixel, illustrated in FIGS. 2(a); and (2b) An imaging configuration with a setting to form a subject image on a plurality of pixels (2×2 pixels), illustrated in FIG. 2(b)

The imaging configuration for the known Bayer arrangement illustrated in FIG. 3(1) forms images of individually different areas of the subject image on the pixels, that is, the RGB pixels, of the imaging device. RGB illustrated in the figures illustrate the RGB pixels of the known Bayer arrangement. Here, only 2×2=4 pixels are illustrated. Each cone indicated by dotted lines conceptually illustrates incident light corresponding to a different area of the subject.

With the configuration, for example, an image with resolution in accordance with the number of pixels of the imaging device can be obtained.

FIGS. 3(2a) and (2b) illustrate the following two examples as examples of the imaging configuration for the four-way split Bayer arrangement illustrated in FIG. 1(2):

FIG. 3(2a) is an imaging configuration that is illustrated in FIG. 2(a) and has a setting where a subject image is formed on each pixel.

The imaging configuration illustrated in FIG. 3(2a) is a configuration to form images of individually different areas of the subject image on the pixels of the imaging device as in FIG. 3(1). If such an imaging process is performed, an image can be obtained which has four-times resolution as compared to the captured image of the imaging device of the known Bayer arrangement of FIG. 3(1).

In contrast, FIG. 3(2b) is another example of the imaging configuration of the four-way split Bayer arrangement illustrated in FIG. 1(2), and corresponds to the imaging configuration of FIG. 2(b). In other words, it is an imaging configuration having a setting where a subject image is formed not on a single pixel but on a plurality of pixels (2×2=4 pixels). Compared to FIG. 3(2a), an image has reduced resolution. In other words, the resolution level is similar to the level of the image obtained by the imaging process using the known Bayer arrangement illustrated in FIG. 3(1).

In this manner, the imaging apparatus of the present disclosure condenses incident light with more coarse resolution than the resolving power of the imaging device (image sensor). In other words, an image is captured which has an optical resolving power lower than a pixel resolving power specified by the pixel density of the imaging device.

In many cases, an imaging apparatus using an imaging device with high-density pixels includes an imaging unit by applying an optical element, such as a lens, having an optical resolving power in accordance with a pixel resolving power corresponding to the pixel density of the imaging device. Such agreement between the pixel resolving power and the optical resolving power makes it possible to form a subject image that is different depending on the pixel, as described above with reference to FIG. 2(a). Accordingly, an image can be captured which has resolution in accordance with the pixel density of the imaging device.

However, the imaging apparatus of the present disclosure captures an image with lower resolution than the pixel resolving power of the imaging device on purpose, as described with reference to FIGS. 2(b) and 3(2b). In other words, it is a configuration where the optical resolving power has been reduced as compared to the pixel resolving power.

Various configurations can be used as the configuration for acquiring an image with the optical resolving power lower than the pixel resolving power. In a first example described below uses the microlenses 124 described with reference to FIG. 2(b).

The configuration of the imaging device including the microlenses 124 is further described with reference to FIG. 4.

Figure 4:
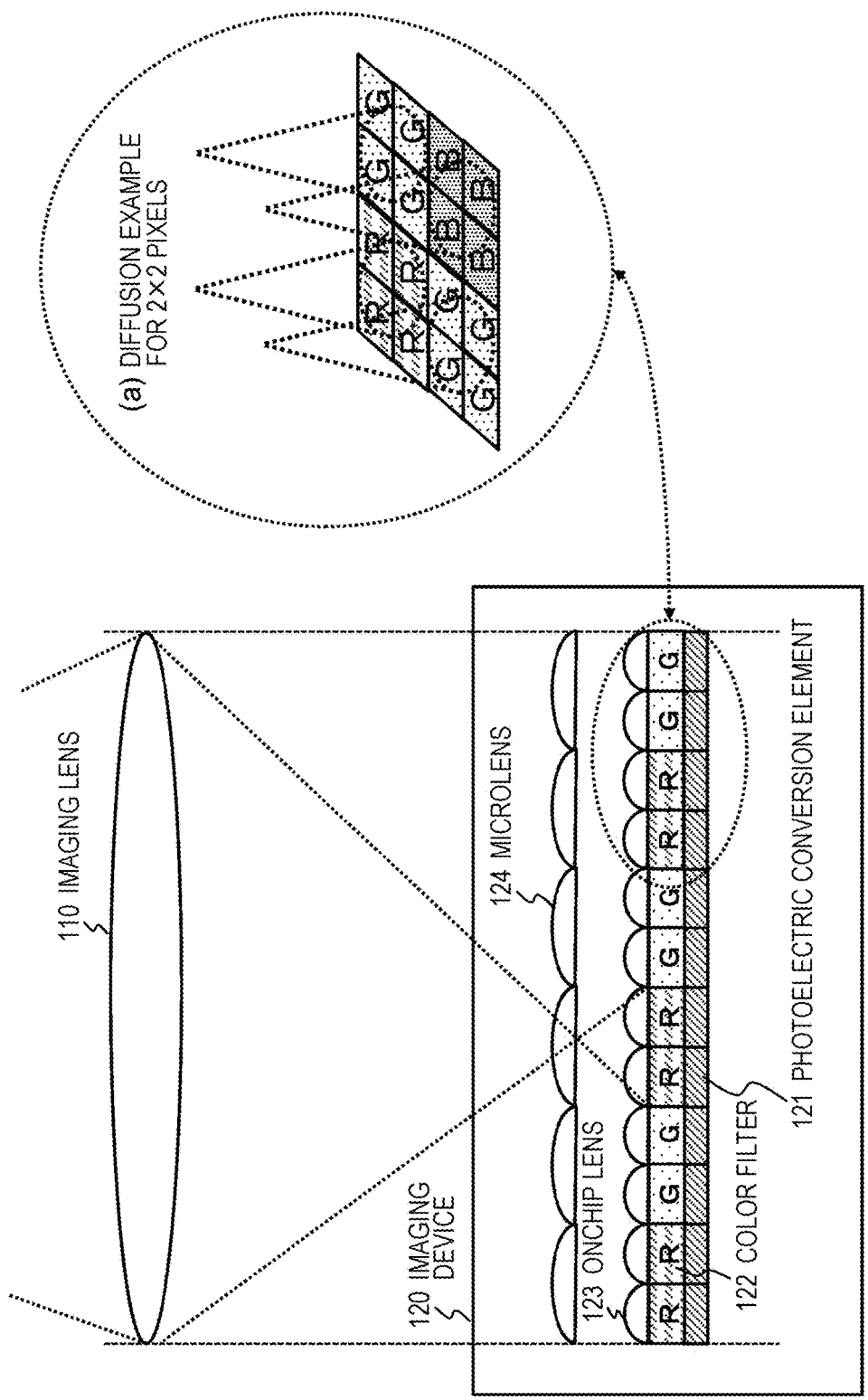
FIG. 4 is a diagram explaining the configuration of the imaging device of the imaging apparatus of the present disclosure.

FIG. 4 illustrates a cross-sectional configuration of the imaging lens 110 and the imaging device 120. It is a similar diagram to the one described above with reference to FIG. 2(b). Furthermore, FIG. 4(a) illustrates a schematic diagram of an imaging configuration for 2×2=4 pixels for a similar imaging device to the one of FIG. 3(2b).

As illustrated in FIG. 4, the imaging device 120 has a configuration where the color filters 122 in which a color (RGB) corresponding to each pixel is set are placed on the photoelectric conversion elements (photodiodes) 121 including pixels arranged in a two-dimensionally array form, and the onchip lenses 123 are further mounted thereon.

The imaging device 120 of the example has a configuration where the microlenses 124 are further placed on the onchip lenses 123 as illustrated in FIG. 4.

As described above, light emitted from the subject in focus is generally designed to be condensed at a position of each photoelectric conversion element (photodiode) via the imaging lens 110. In other words, it is the imaging configuration described above with reference to FIG. 2(a).

However, the imaging apparatus of the present disclosure condenses the light emitted from the subject onto the microlens 124 via the imaging lens 110, and applies the light spreading over 2N×2N (N is any integer) pixels (photoelectric conversion elements).

The example illustrated in FIG. 4(a) is a setting to diffuse incident light from the same subject area over 2×2 pixels in a case of N=1, and let in the light, as in the above description with reference to FIG. 3(2b).

With such a configuration, light of substantially the same amount enters each pixel included in a cluster of pixels, in other words, each individual pixel forming 2×2=4 pixels, in a local area exposed to the diffused light.

Therefore, each output of the 2×2=4 pixels should be a uniform output value (pixel value).

However, if a defective pixel is included in one pixel cluster where the same subject light is diffused and enters, in other words, 2×2=4 pixels illustrated in FIG. 4(a) in the example, the output value (pixel value) of only the defective pixel has a different value from the output values (pixel values) of the other pixels (normal pixels) among the pixel cluster (four pixels). In this manner, if the output pixel values of individual pixels of one pixel cluster where the same subject light enters are not uniform, the pixel cluster can be estimated to include a defective pixel.

In this manner, the imaging apparatus of the present disclosure compares the output values (pixel values) of pixels forming a pixel cluster on a pixel cluster basis where the same subject light enters, determines that the pixel cluster include a defective pixel if the outputs are not uniform, and further performs the process of identifying the defective pixel.

With such a process, it becomes possible to detect a defective pixel with high accuracy without confusing, for example, an edge area of an image with a defective pixel.

The output pixel value of the detected defective pixel is corrected in a signal processing unit of the imaging apparatus, and then output.

In the example, the color filter arrangement is described taking an example where the four-way split Bayer RGB arrangement described with reference to FIG. 1(2) is used. However, the processing of the present disclosure can be applied to imaging devices having various arrangements other than the four-way split Bayer RGB arrangement.

Moreover, FIGS. 3 (2b) and 4 (a) illustrate the configuration of one pixel cluster where the same subject light is diffused and enters, taking an example of 2×2=4 pixels. However, the setting of the pixel cluster is not limited to such a setting of 2×2 pixels and various settings are possible.

Various settings, for example, a setting, illustrated in FIG. 5(b), in which the pixel cluster where the same subject light is diffused and enters is 4×4=16 pixels and, a setting, illustrated in FIG. 5(c), in which the pixel cluster where the same subject light is diffused and enters is 8×8=64 pixels are possible.

However, upon the comparison of pixel values in a case of detecting a defective pixel, the output values of the same color pixels in a pixel cluster where the same subject light is diffused and enters are compared.

[2. Configuration and Process of the Imaging Apparatus of the Present Disclosure]

Next, configuration and process examples of the imaging apparatus of the first example of the present disclosure are described with reference to FIG. 6 and later figures.

Figure 6:
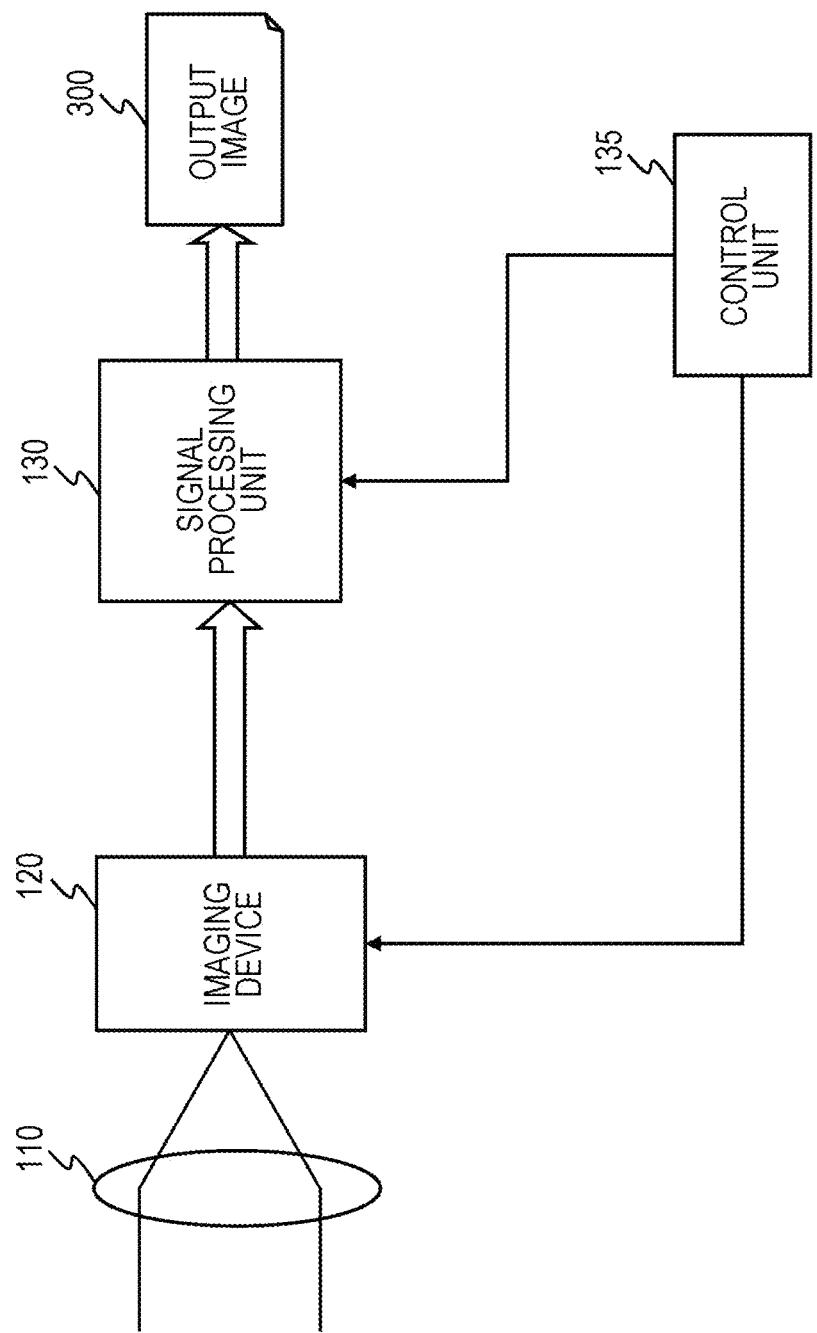
FIG. 6 is a diagram explaining an example of the entire configuration of the imaging apparatus of the present disclosure.

FIG. 6 is a diagram illustrating the entire configuration of an imaging apparatus 100 according to the first example of the present invention.

The light incident via the optical lens 110 enters the imaging unit, for example, the imaging device 120 including a CMOS image sensor or the like to output image data by photoelectric conversion.

The imaging device 120 is the imaging device 120 having, for example, the configuration illustrated in FIG. 4. For example, the imaging device 120 has the four-way split Bayer RGB arrangement described with reference to FIG. 1(2), and has clusters of pixels, in each of which the same subject light is diffused and enters, as illustrated in FIG. 4(a), FIGS. 5(b), 5(c), or the like.

The image data output from the imaging device 120 illustrated in FIG. 6 is input into a signal processing unit 130. The signal processing unit 130 executes processes, for example, the detection of a defective pixel and the correction of the pixel value of the defective pixel, which are described below, further executes general signal processing in a camera, such as white balance (WB) adjustment and gamma correction, and generates an output image 300. The output image 300 is stored in an unillustrated storage unit, or output to a display unit.

A control unit 135 outputs a control signal to each unit in accordance with a program stored in, for example, the unillustrated memory, and performs the control of various processes.

Next, an example of the configuration of the signal processing unit 130 is described with reference to FIG. 7.

Figure 7:
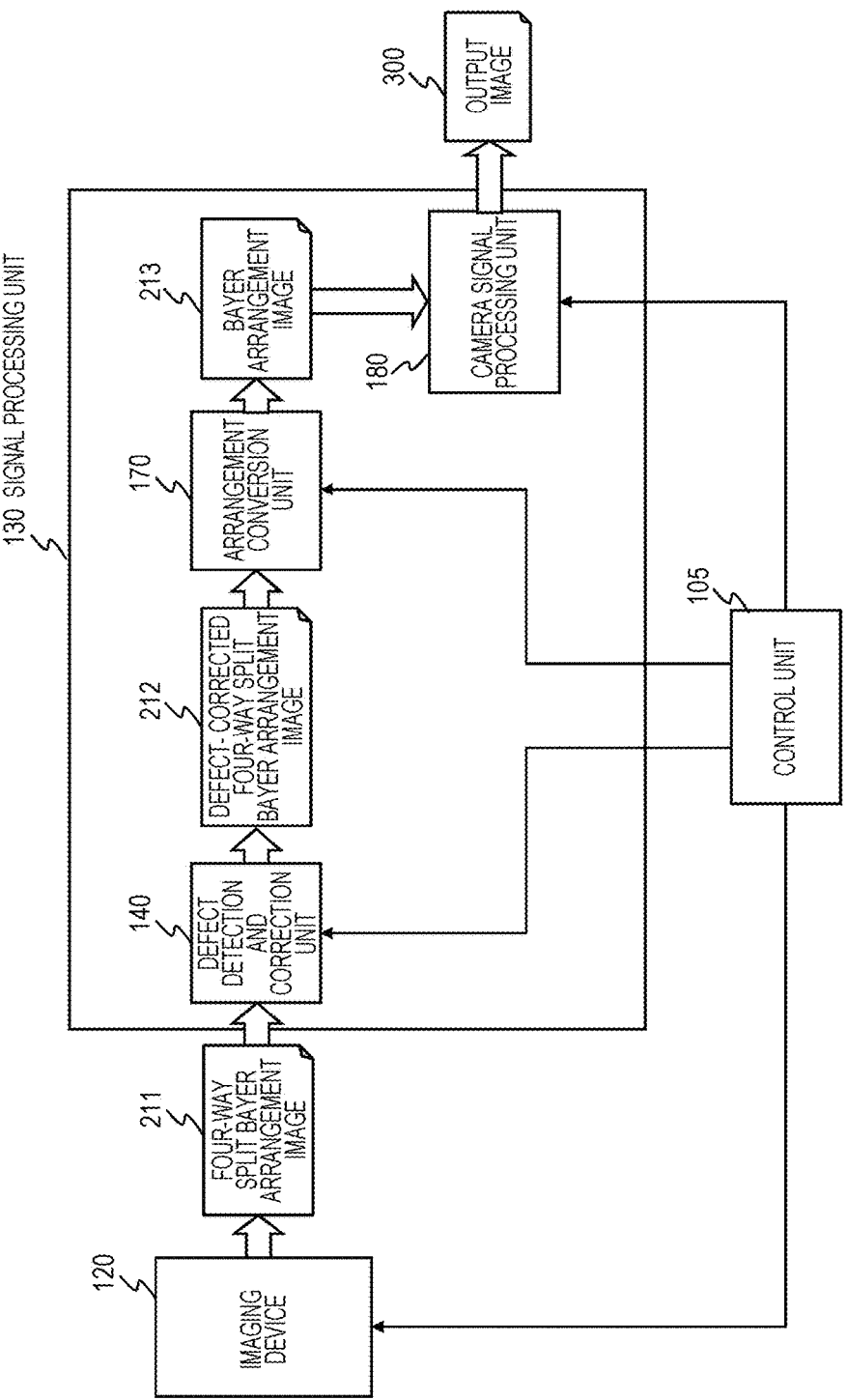
FIG. 7 is a diagram explaining one example of a signal processing unit of the imaging apparatus of the present disclosure.

FIG. 7 is a diagram illustrating the configuration of the signal processing unit 130 of one example of the present disclosure.

The signal processing unit 130 includes a defect detection and correction unit 140, an arrangement conversion unit 170, and a camera signal processing unit 180, as illustrated in FIG. 7.

The imaging device 120 has the pixel arrangement described with reference to FIG. 1(2), and generates and outputs a four-way split Bayer arrangement image 211.

The four-way split Bayer arrangement image 211 output by the imaging device 120 includes clusters of pixels, in each of which the same subject light is diffused and enters, as illustrated with reference to FIG. 4.

The four-way split Bayer arrangement image 211 output from the imaging device 120 is input into the defect detection and correction unit 140.

The defect detection and correction unit 140 inputs the four-way split Bayer arrangement image 211 from the imaging device 120, analyzes the pixel values of pixels forming the image, and detects a defective pixel. Furthermore, the process of correcting the pixel value of the detected defective pixel is executed. As a result, a defect-corrected four-way split Bayer arrangement image 212 is generated and output.

The defect-corrected four-way split Bayer arrangement image 212 generated by the defect detection and correction unit 140 is input into the arrangement conversion unit 170.

The arrangement conversion unit 170 inputs the defect-corrected four-way split Bayer arrangement image 212 from the defect detection and correction unit 140, and executes the process of converting the four-way split Bayer arrangement into the normal Bayer arrangement, in other words, the Bayer arrangement image illustrated in FIG. 1(1). The arrangement conversion unit 170 generates a Bayer arrangement image 213 by the arrangement conversion, and outputs the Bayer arrangement image 213 to the camera signal processing unit 180.

The camera signal processing unit 180 inputs the Bayer arrangement image 213 output from the arrangement conversion unit 170, and executes the demosaicing process of setting all RGB colors at the RGB pixel positions of the Bayer arrangement image. Furthermore, general signal processing in a camera, such as white balance (WB) adjustment and gamma correction, is executed. The output image 300 is generated and output.

The control unit 135 outputs a control signal to each unit in accordance with a program stored in, for example, the unillustrated memory, and performs the control of various processes.

[3. Configuration and Process of the Defect Detection and Correction Unit]

Next, the configuration and process of the defect detection and correction unit 140 are described with reference to FIG. 8.

Figure 8:
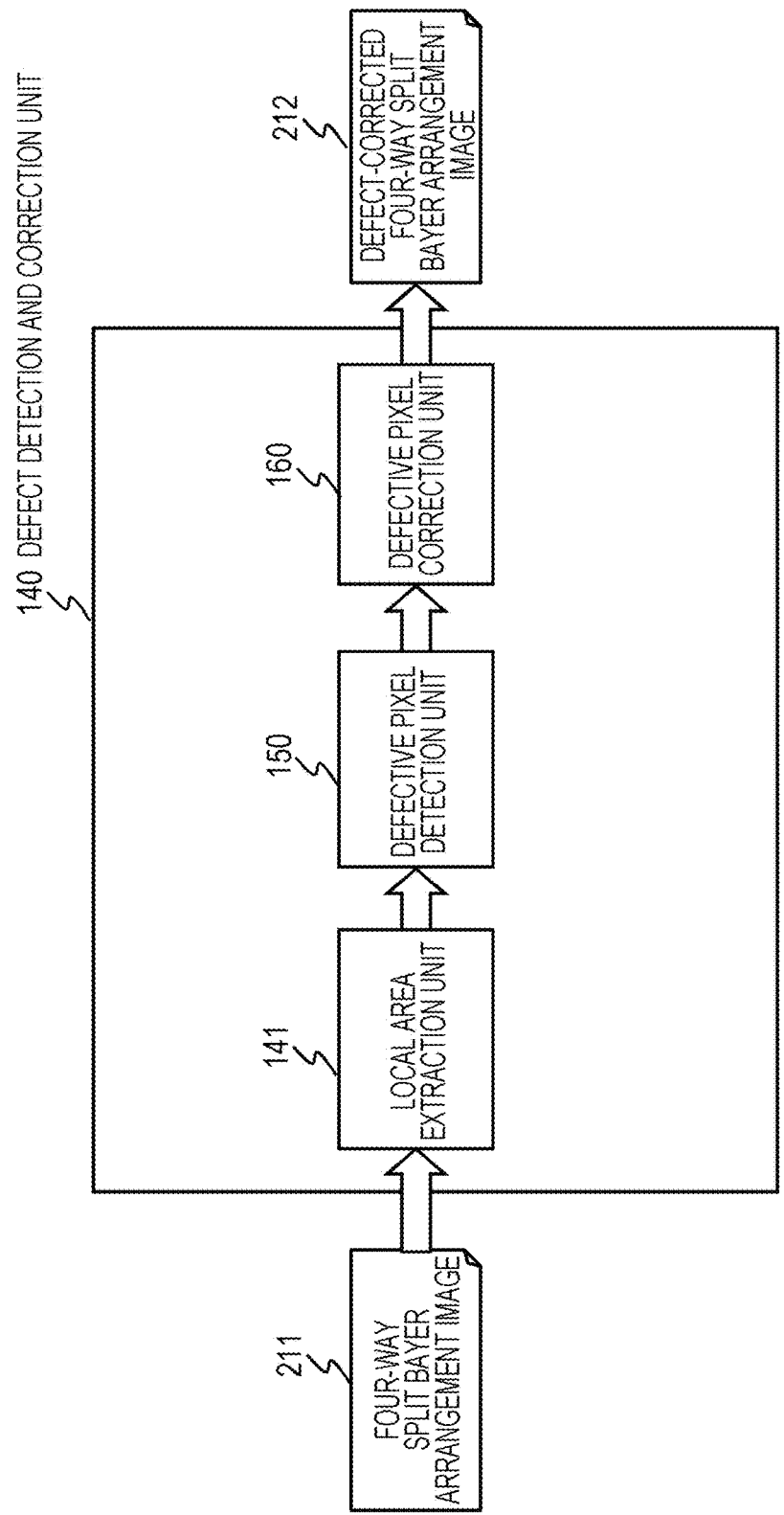
FIG. 8 is a diagram explaining an example of the configuration of a defect detection and correction unit of the signal processing unit of the imaging apparatus of the present disclosure.

The defect detection and correction unit 140 includes a local area extraction unit 141, a defective pixel detection unit 150, and a defective pixel correction unit 160, as illustrated in FIG. 8.

The four-way split Bayer arrangement image 211 output by the imaging device 120 is input into the local area extraction unit 141 of the defective pixel detection and correction unit 140.

The local area extraction unit 141 selects and extracts the pixel values of a local area used by the downstream defective pixel detection unit 150. The local area is an area corresponding to a pixel cluster as one unit where the same subject light is diffused and enters. For example, in a case of the configuration illustrated in FIG. 4, pixel areas each including 2×2 pixels are sequentially extracted as the local areas.

Moreover, if the same subject light is diffused and enters in clusters of 4×4 pixels illustrated in FIG. 5(b), then the 4×4-pixel areas are extracted as the local areas.

Moreover, if the same subject light is diffused and enters in clusters of 8×8 pixels illustrated in FIG. 5(c), then the 8×8-pixel areas are extracted as the local areas.

Information on the pixels of the local area extracted by the local area extraction unit 141 is output to the defective pixel detection unit 150.

The defective pixel detection unit 150 executes the defective pixel detection process on a local area basis, in other words, on a pixel cluster basis for the diffusion and entrance of the same subject light.

The specific configuration and process of the defective pixel detection unit 150 are described in detail below.

Information on the defective pixel detected by the defective pixel detection unit 150 is output to the defective pixel correction unit 160.

The defective pixel correction unit 160 executes the process of correcting the pixel value of the defective pixel identified based on the information on the defective pixel detected by the defective pixel detection unit 150.

The specific configuration and process of the defective pixel correction unit 160 are described in detail below.

The defective pixel correction unit 160 generates the defect-corrected four-way split Bayer arrangement image 212 where the pixel value of the defective pixel has been corrected, and outputs the defect-corrected four-way split Bayer arrangement image 212 to the arrangement conversion unit 170 in the signal processing unit 130 illustrated in FIG. 7.

[3-1. Details of the Configuration and Process of the Defective Pixel Detection Unit]

Next, the specific configuration of the defective pixel detection unit 150 in the defect detection and correction unit 140 illustrated in FIG. 8 is described with reference to FIG. 9.

Figure 9:
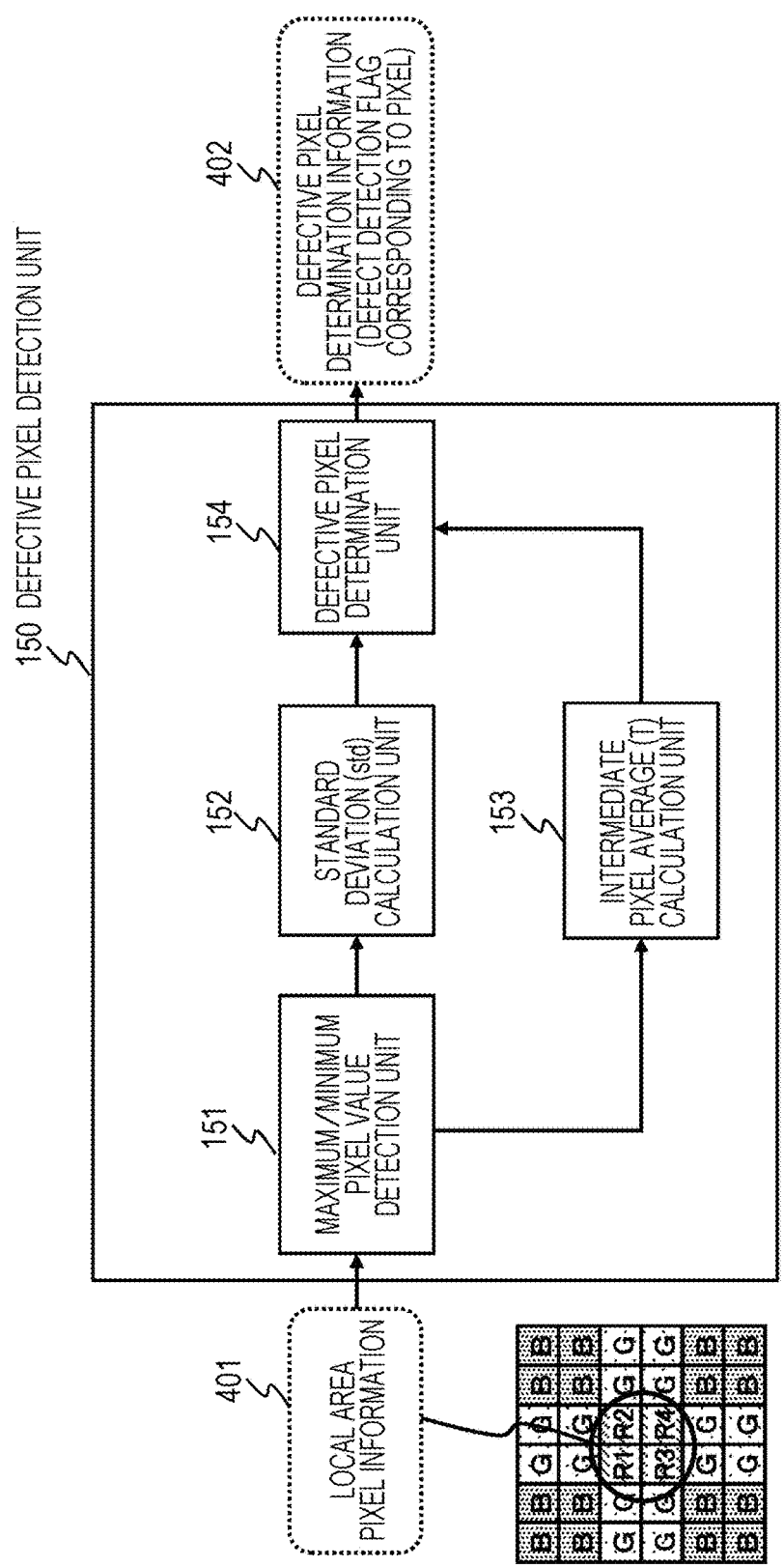
FIG. 9 is a diagram explaining an example of the detailed configuration of a defective pixel detection unit of the defect detection and correction unit.

FIG. 9 is a diagram illustrating the specific configuration of the defective pixel detection unit 150 in the defect detection and correction unit 140 illustrated in FIG. 8.

As illustrated in FIG. 9, the defective pixel detection unit 150 includes a maximum/minimum pixel value detection unit 151, a standard deviation (std) calculation unit 152, an intermediate pixel value average (T) calculation unit 153, and a defective pixel determination unit 154.

The maximum/minimum pixel value detection unit 151 inputs local area pixel information 401 extracted by the local area extraction unit 141 of the defect detection and correction unit 140 illustrated in FIG. 8.

The local area extraction unit 141 extracts the pixel value information of a pixel cluster where the same subject light is diffused and enters as the local area pixel information 401, as described above. For example, in the case of the configuration illustrated in FIGS. 4 and 4 (a), one local area is a pixel area including 2×2 pixels. Pieces of the local area pixel information 401 are sequentially generated on the local area basis, and outputs the local area pixel information 401 to the maximum/minimum pixel value detection unit 151 of the defective pixel detection unit 150 illustrated in FIG. 9.

The maximum/minimum pixel value detection unit 151 detects the maximum and minimum pixel values of the same color pixels included in the local area pixel information 401.

In the process example described below, a description is given assuming the local area to be the same color pixel area including 2×2 pixels. The local area of 2×2=4 pixels includes only four pixels of the same color: R, G, or B.

FIG. 9 illustrates an example of inputting 2×2, four R pixels of R1, R2, R3, and R4, in the four-way split Bayer RGB arrangement, as an example of the local area pixel information 401.

The maximum/minimum pixel value detection unit 151 detects a pixel having the maximum pixel value and a pixel having the minimum pixel value from the four same color pixels of 2×2 =4 pixels, and outputs the detection information, together with the local area pixel information 401, to the standard deviation (std) calculation unit 152 and the intermediate pixel average (T) calculation unit 153.

The standard deviation (std) calculation unit 152 calculates the standard deviation (std) of the pixel values of a plurality of the same color pixels included in the local area pixel information 401. The standard deviation (std) is calculated in accordance with (Equation 1) illustrated below.

[Mathematical Formula 1]

$$ave = \frac{1}{n}\sum_i C_i \quad \text{(Equation 1)}$$

$$std = \sqrt{\frac{1}{n}\sum_i \|C_i - ave\|^2}$$

In the above (Equation 1), ave: the pixel value average of the same color pixels in the local area, n: the number of the same color pixels in the local area, i: an index corresponding to each pixel of the same color pixels in the local area) i=1, 2, 3, . . . n, Ci: the pixel value of a pixel, to which an index i has been set, of the same color pixels (C=R, G, or B) in the local area, and std: the standard deviation of the pixel values of the same color pixels in the local area.

For example, if the local area includes four pixels, R1 to R4, as illustrated in FIG. 9, the following values are applied:

n=4, i=1 to 4, and

Ci=the pixel value of each of R1 to R4.

The value of the standard deviation (std) calculated by the standard deviation (std) calculation unit 152 in accordance with the above (Equation 1) is input into the defective pixel determination unit 154.

The intermediate pixel average (aye) calculation unit 153 calculates the average of the pixel values of pixels having intermediate pixel values except the maximum and minimum pixel values among the pixel values of the plurality of the same color pixels included in the local area pixel information 401, in other words, an intermediate pixel average (T). The intermediate pixel average (T) is calculated in accordance with the following (Equation 2).

[Mathematical Formula 2]

$$T = \frac{1}{n-2}(2ndMAX + \ldots + 2ndMin) \quad \text{(Equation 2)}$$

In the above (Equation 2), n: the number of the same color pixels in the local area, 2ndMax: the second maximum pixel value of the same color pixels in the local area, 2ndMin: the second minimum pixel value of the same color pixels in the local area, and T: the intermediate pixel average.

For example, if the local area includes four pixels, R1 to R4, as illustrated in FIG. 9, the following values are applied:

n=4,

2ndMax: the pixel value having the second maximum value of R1 to R4, and

2ndMin=the pixel value having the second minimum value of R1 to R4.

The value of the intermediate pixel average (T) calculated by the intermediate pixel average (T) calculation unit 153 in accordance with the above (Equation 2) is input into the defective pixel determination unit 154.

The defective pixel determination unit 154 inputs the following values:

(1) the value of the standard deviation (std) calculated by the standard deviation (std) calculation unit 152 in accordance with the above (Equation 1), and (2) the value of the intermediate pixel average (T) calculated by the intermediate pixel average (T) calculation unit 153 in accordance with the above (Equation 2).

The defective pixel determination unit 154 inputs these values, and determines whether the pixels of interest selected sequentially from the same color pixels included in the local area are a defective pixel.

The determination process is performed in accordance with (Equation 3) illustrated below.

[Mathematical Formula 3]

$$\text{if}(std > TH1 \cap \|T - Ci\| > TH2) \quad \text{(Equation 3)}$$

In the above (Equation 3), std: the value of the standard deviation calculated in accordance with the above (Equation 1), T: the intermediate pixel average calculated in accordance with the above (Equation 2), TH1: the preset threshold value, TH2: the preset threshold value, and Ci: the pixel value of a pixel of interest selected sequentially from the local area.

If (Equation 3) illustrated above holds for a pixel of interest (Ci) selected sequentially from the local area, the pixel of interest (Ci) is determined to be a defective pixel.

On the other hand, if (Equation 3) illustrated above does not hold for a pixel of interest (Ci), the pixel of interest (Ci) is determined not to be a defective pixel.

The above (Equation 3) is an equation for determining a pixel of interest (Ci) to be a defective pixel if the following two conditions are satisfied for the pixel of interest (Ci).

(First Condition) that the standard deviation (std) calculated in accordance with the above-described (Equation 1), using pixels of the same color as the pixel of interest (Ci) in the local area including the pixel of interest, is larger than the preset threshold value (TH1).

(Second Condition) that the difference absolute value between the intermediate pixel average (T) calculated in accordance with the above-described (Equation 2), using pixels of the same color as the pixel of interest (Ci) in the local area including the pixel of interest, and the pixel value (Ci) of the pixel of interest is larger than the preset threshold value (TH2).

In other words, if variations in the pixel values of the same color pixels included in the local area are large, and if the difference between the average of the intermediate pixel values except the maximum and minimum pixel values of the same color pixels included in the local area, and the pixel value of the pixel of interest is large, the pixel of interest is determined to be a defective pixel.

The defective pixel determination unit 154 determines whether or not the pixel of interest Ci selected sequentially from the local area satisfies the above (Equation 3). If so, the defective pixel determination unit 154 determines the pixel of interest to be a defective pixel and, if not, determines the pixel of interest not to be a defective pixel.

The defective pixel determination unit 154 generates defective pixel determination information 402 such as a defect determination flag corresponding to each pixel of interest, as information indicating the determination result, and outputs the defective pixel determination information 402 to the downstream defective pixel correction unit 160.

The defect determination flag is, for example, a flag where [1] is set if the pixel of interest is a defective pixel, and [0] is set if it is not a defective pixel.

The defective pixel detection unit 150 selects the pixels included in the local area sequentially as the pixel of interest, and repeatedly executes the process of determining whether or not the selected pixel of interest is a defective pixel, switching the pixels of interest sequentially.

As a result, all pixels included in the pixels of interest are determined whether or not to be a defective pixel.

The local areas are changed and set sequentially to execute a similar process on all the pixels forming the image.

Next, the sequence of the defective pixel detection process executed by the defective pixel detection unit 150 illustrated in FIG. 9 is described with reference to the flowchart illustrated in FIG. 10.

Figure 10:
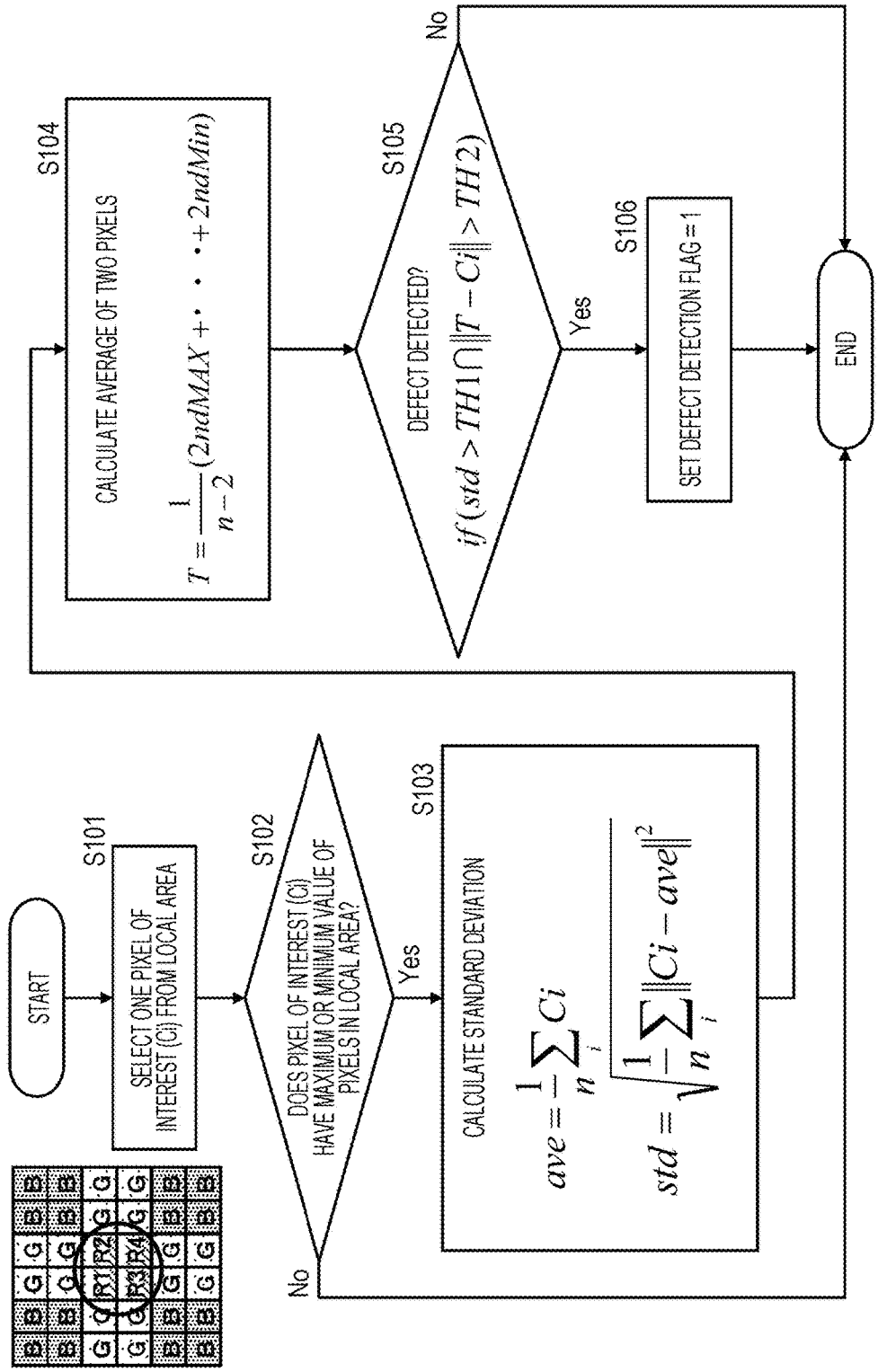
FIG. 10 is a diagram illustrating a flowchart explaining a process sequence to be executed by the defective pixel detection unit of the defect detection and correction unit.

In order to facilitate understanding, specific local area pixel information is described taking an example where pixel information of a 2×2-pixel area including the R1 to R4 pixels in the center of the four-way split Bayer RGB arrangement illustrated on the top left corner of FIG. 10 is input to perform the process.

Firstly, in Step S101, one pixel of interest (Ci) is selected from the local area.

The flowchart illustrated in FIG. 10 is repeatedly executed, selecting the pixels included in the local area sequentially as the pixel of interest.

Here, a description is given assuming that the pixel R1 being one of the pixels R1 to R4 forming the local area has been selected as the pixel of interest.

Next, in Step S102, the pixel of interest (Ci) is determined whether or not to have the maximum or minimum pixel value of the same color pixels of the local area.

If the pixel of interest (Ci=R1) has the maximum or minimum pixel value of the same color pixels in the local area (the determination of Step S102=Yes), the processing proceeds to Step S103.

On the other hand, if the pixel of interest does not have the maximum or minimum pixel value of the same color pixels in the local area (the determination of Step S102=No), the pixel of interest (Ci=R1) is determined not to be a defective pixel. The processing then ends.

If the pixel of interest (Ci) is the pixel R1, the following determination process is performed.

The pixel of interest R1 is determined whether or not to be a pixel having the maximum pixel value that is a pixel value larger than the pixel values of the other pixels R2, R3, and R4, or whether or not to be a pixel having the minimum pixel value that is a value smaller than the pixel values of the other pixels R2, R3, and R4.

If the pixel of interest is determined to have the maximum or minimum pixel value of the same color pixels in the local area in the determination process of Step S102, the processing proceeds to Step S103.

In Step S103, the standard deviation (std) of the pixel values of the plurality of same color pixels included in the local area is calculated.

The process is the process executed by the standard deviation (std) calculation unit 152 described above with reference to FIG. 9.

The standard deviation (std) of the pixel values of the plurality of the same color pixels included in the local area is calculated in accordance with the above-described (Equation 1).

For example, if the pixels included in the local area are R1 to R4, the standard deviation (std) is calculated, setting the pixel values of the four pixels in Ci of the above-mentioned (Equation 1).

Next, in Step S04, the average of the pixel values of pixels having intermediate pixel values except the maximum and minimum pixel values of the pixel values of the plurality of the same color pixels included in the local area, in other words, the intermediate pixel average (T), is calculated.

The process is the process executed by the intermediate pixel average (ave) calculation unit 153 described above with reference to FIG. 9.

The average of the pixel values of the pixels having intermediate pixel values except the maximum and minimum pixel values of the pixel values of the plurality of the same color pixel values included in the local area, in other words, the intermediate pixel average (T), is calculated in accordance with (Equation 2) described above.

For example, if the pixels included in the local area are R1 to R4, the average of two pixel values having the intermediate pixel values except the maximum and minimum pixel values among the pixel values of the four pixels is calculated as the intermediate pixel average (T).

Next, in Step S105, the process of determining whether or not the pixel of interest (Ci) is a defective pixel is executed.

The process is the process executed by the defective pixel determination unit 154 described above with reference to FIG. 9.

As described above, the defective pixel determination unit 154 determines whether or not the pixel of interest (Ci) is a defective pixel based on the following values:

(1) the value of the standard deviation (std) calculated by the standard deviation (std) calculation unit 152 in accordance with the above (Equation 1), and (2) the value of the intermediate pixel average (T) calculated by the intermediate pixel average (T) calculation unit 153 in accordance with the above (Equation 2).

The defective pixel determination unit 154 inputs these values, and determines whether the pixels of interest (Ci) selected sequentially from the same color pixels included in the local area are a defective pixel.

The determination process is performed in accordance with (Equation 3) illustrated above.

If (Equation 3) holds for a pixel of interest, the pixel of interest is determined to be a defective pixel.

On the other hand, if (Equation 3) does not hold for a pixel of interest, the pixel of interest is determined not to be a defective pixel.

If (Equation 3) holds for a pixel of interest, and the pixel of interest is determined to be a defective pixel, the processing proceeds to Step S106, and the value of the defect detection flag being the flag corresponding to the pixel of interest is set to [1].

On the other hand, if (Equation 3) does not hold for a pixel of interest, and the pixel of interest is determined not to be a defective pixel, the processing is ended. In this case, the value of the defect detection flag being the flag corresponding to the pixel of interest remains to be set to the initial value [0].

The pixels included in the local area are selected sequentially as the pixel of interest, and the flow illustrated in FIG. 10 is executed sequentially and repeatedly on the selected pixel-of-interest basis.

As a result, all pixels included in the pixels of interest are determined whether or not to be a defective pixel.

The local areas are changed and set sequentially to execute a similar process on all the pixels forming the image.

[3-2. Details of the Configuration and Process of the Defective Pixel Correction Unit]

Figure 11:
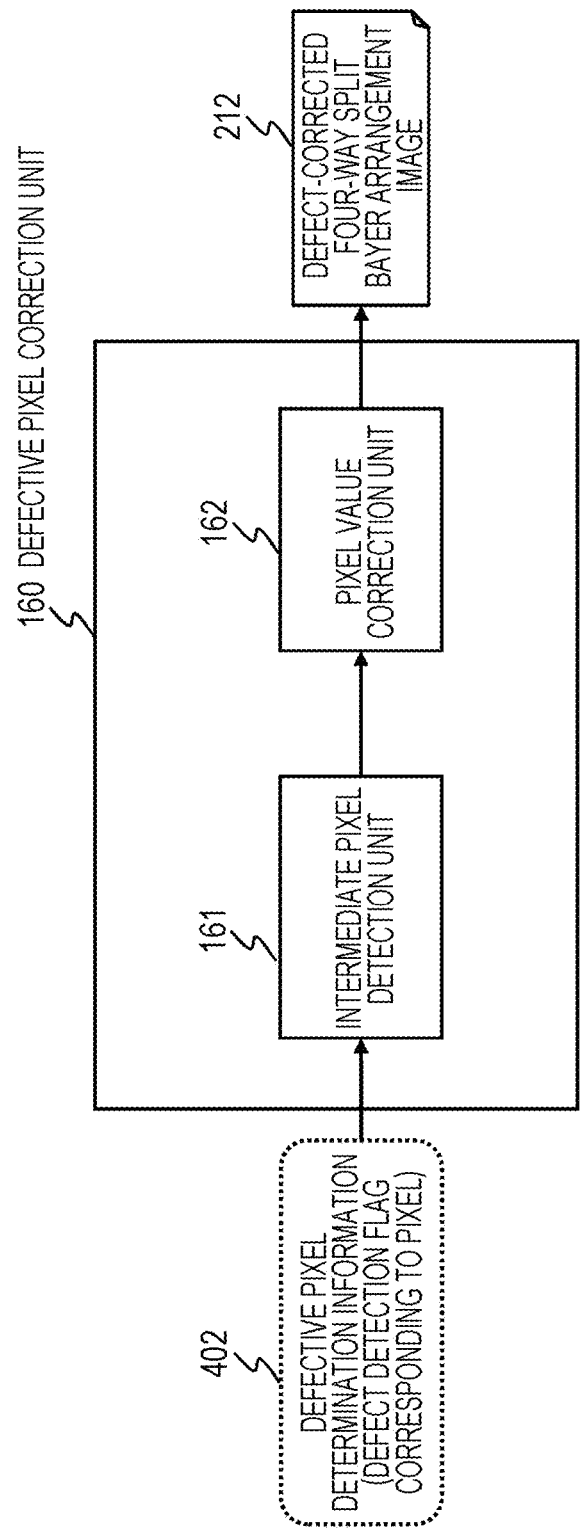
FIG. 11 is a diagram explaining an example of the detailed configuration of a defective pixel correction unit of the defect detection and correction unit.

Next, the configuration and process of the defective pixel correction unit 160 in the defect detection and correction unit 140 illustrated in FIG. 8 is described in detail with reference to FIG. 11.

The defective pixel correction unit 160 performs the process of correcting the pixel value of the pixel determined to be a defective pixel by the upstream defective pixel detection unit 150.

The upstream defective pixel detection unit 150 inputs the defective pixel determination information (the defect determination flag corresponding to the pixel) 402, together with the pixel information of the local area. The pixel determined to be a defective pixel is identified based on the flag to correct the pixel value of the defective pixel.

The intermediate pixel detection unit 161 acquires the following pixel values of pixels of the same color as the defective pixel, from the local area including the defective pixel:

(a) the pixel value of a pixel having the next pixel value after the maximum pixel value, in other words, the second maximum pixel value, in the local area (2ndMax), and (b) the pixel value of a pixel having the next pixel value after the minimum pixel value, in other words, the second minimum pixel value, in the local area (2ndMin).

The intermediate pixel detection unit 161 acquires these pieces of the pixel value information and outputs them to the pixel value correction unit 162.

Firstly, the pixel value correction unit 162 determines whether a pixel of interest (Ci) determined to be a defective pixel, which is a correction target, is a pixel having the maximum or minimum value among the same color pixels in a local area to which the pixel of interest belongs.

If the pixel of interest is the maximum value pixel in the local area to which the pixel of interest belongs, a pixel value correction is made where the pixel value of the pixel of interest is set to the pixel value (2ndMax) input from the intermediate pixel detection unit 161.

In other words, the pixel value of the pixel of interest is corrected to the pixel value of a pixel having the next pixel value after the maximum pixel value, in other words, the second maximum pixel value, of the same color in the local area (2ndMax).

On the other hand, if the pixel of interest is the minimum value pixel in the local area to which the pixel of interest belongs, a pixel value correction is made where the pixel value of the pixel of interest is set to the pixel value (2ndMin) input from the intermediate pixel detection unit 161.

In other words, the pixel value of the pixel of interest is corrected to the pixel value of a pixel having the next pixel value after the minimum pixel value, in other words, the second minimum pixel value, of the same color in the local area (2ndMin).

The defective pixel correction unit 160 corrects defective pixels in local areas sequentially.

Moreover, the local areas are changed and set sequentially. A similar correction process is executed on all defective pixels forming the image.

With the process, all the defective pixels of the process target image are corrected. The defect-corrected four-way split Bayer arrangement image 212 illustrated in FIG. 11 is generated and output to the downstream arrangement conversion unit 170 (refer to FIG. 7).

Next, the detailed sequence of the defective pixel correction process executed by the defective pixel correction unit 160 is described with reference to the flowchart illustrated in FIG. 12.

Firstly, in Step S201, one pixel of interest (Ci) is input.

Figure 12:
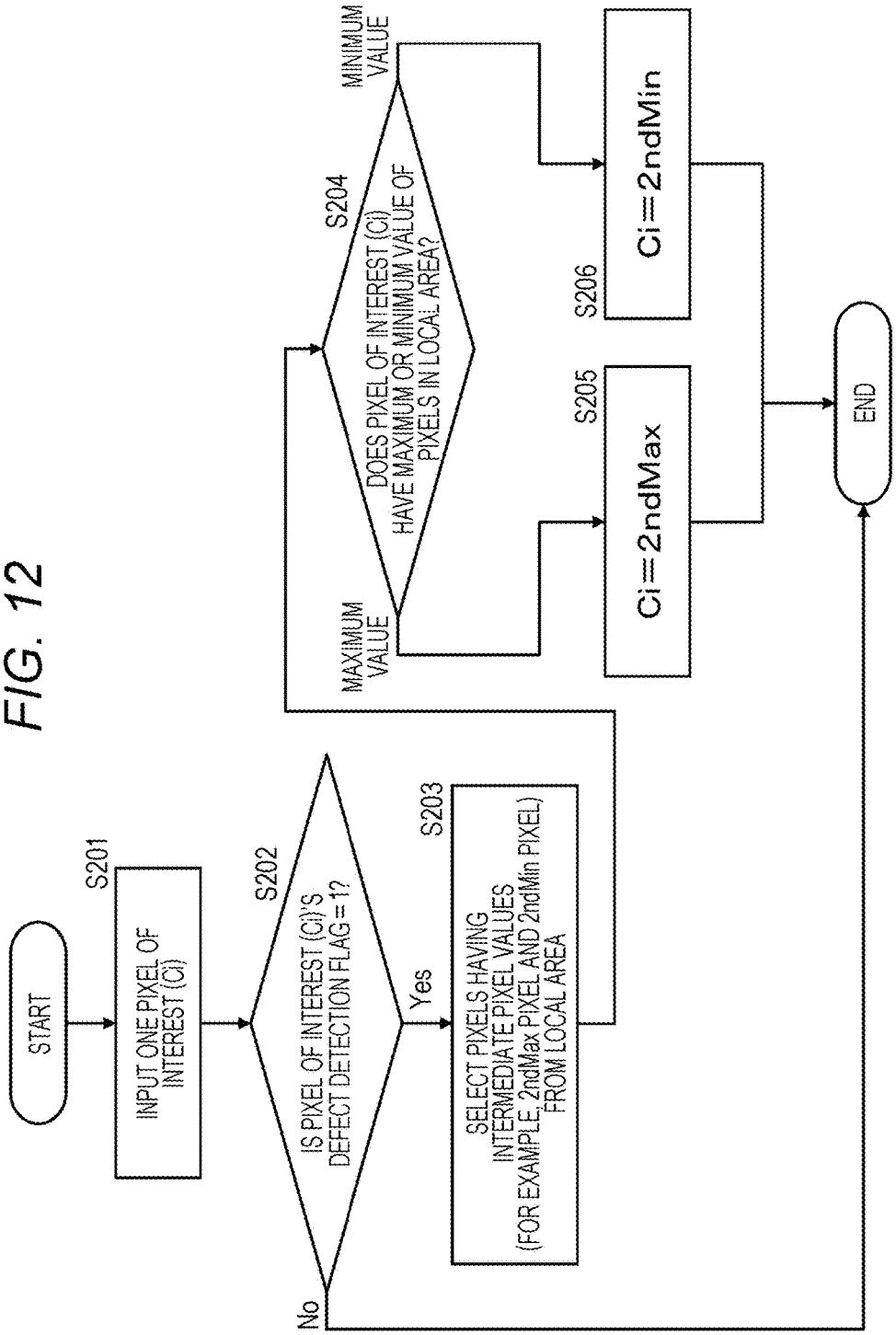
FIG. 12 is a diagram illustrating a flowchart explaining a process sequence to be executed by the defective pixel correction unit of the defect detection and correction unit.

The flow illustrated in FIG. 12 is executed repeatedly on all the pixels the pixels in the process image, setting the pixels sequentially as the pixel of interest.

Next, in Step S202, it is determined whether or not the setting of the defect detection flag of the pixel of interest is set to the value indicating to be a defective pixel, [1].

If the defect detection flag=1, the processing proceeds to Step S203.

On the other hand, if the defect detection flag=0, in other words, indicates not to be a defective pixel, the processing is ended without making a correction.

If the value of the defect detection flag of the pixel of interest (Ci) is [1], and the pixel of interest is a defective pixel, the processing proceeds to Step S203.

In Step S203, the pixel values of the second maximum pixel value (2ndMax) and the second minimum pixel value (2ndMin) among the pixels of the same color as the pixel of interest are acquired from a local area to which the pixel of interest belongs.

Next, in Step S204, it is determined whether the pixel of interest (Ci) is a pixel having the maximum or minimum pixel value among the same color pixels in the local area to which the pixel of interest belongs.

If it is determined that the pixel of interest (Ci) is a pixel having the maximum pixel value among the same color pixels in the local area to which the pixel of interest belongs, the processing proceeds to Step S205. In Step S205, the pixel value of the pixel of interest is set to the second maximum pixel value (2ndMax) among the pixels of same color as the pixel of interest in the local area to which the pixel of interest belongs. In other words, the pixel value (Ci) of the pixel of interest is set as follows:

$$Ci=2ndMax$$

On the other hand, if it is determined in Step S204 that the pixel of interest (Ci) is a pixel having the minimum pixel value among the same color pixels in the local area to which the pixel of interest belongs, the processing proceeds to Step S206. In Step S206, the pixel value of the pixel of interest is set to the second minimum pixel value (2ndMin) among the pixels of the same color as the pixel of interest in the local area to which the pixel of interest belongs. In other words, the pixel value (Ci) of the pixel of interest is set as follows:

$$Ci=2ndMin$$

The defective pixel correction unit 160 sets the pixels in the process target image sequentially as the pixel of interest, and repeatedly executes the process in accordance with the flow illustrated in FIG. 12.

With the process, all the defective pixels of the process target image are corrected. The defect-corrected four-way split Bayer arrangement image 212 illustrated in FIG. 11 is generated and output to the downstream arrangement conversion unit 170 (refer to FIG. 7).

[4. Example Using a Low-resolution Lens for the Imaging Lens]

Next, an example where a low-resolution lens is used for the imaging lens is described as a second example of the imaging apparatus of the present disclosure.

As described above with reference to FIG. 4 and the like, the imaging apparatus of the present disclosure has a configuration where the same subject light is diffused over and enters a plurality of pixels of the imaging device.

In other words, it is configured to acquire an image with a lower optical resolving power than a pixel resolving power corresponding to the pixel density of the imaging device.

In order to acquire such an image, the above-mentioned first example is configured in such a manner as to place the microlens 124 between the imaging lens 110 and the photoelectric conversion element 121, and diffuse incident light from the imaging lens 110 as described with reference to FIG. 4 and the like.

In this manner, it is configured in such a manner as that the same subject light is blurred on purpose and applied to a plurality of pixels of the imaging device and accordingly light of uniform intensity is applied to the plurality of pixels. The pixel values of the same color pixels in the local area are compared to enable the highly accurate detection of a defective pixel.

A configuration other than the configuration using the microlens illustrated in FIG. 4 is also feasible as the configuration to apply the same subject light to a plurality of pixels of the imaging device.

Figure 13:
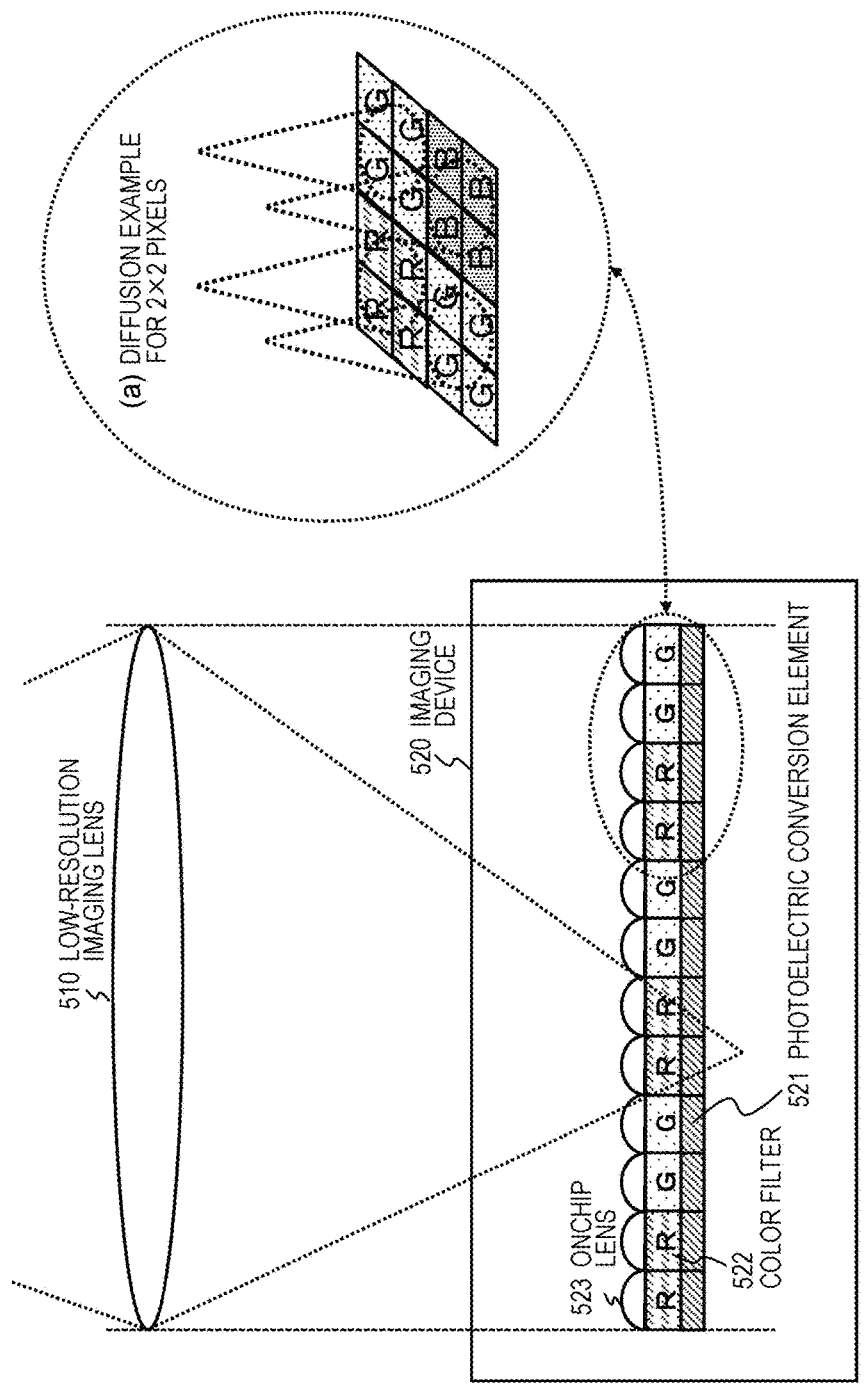
FIG. 13 is a diagram explaining an example of the configuration of the imaging device of the imaging apparatus of the present disclosure.

For example, as illustrated in FIG. 13, a configuration using a low-resolution imaging lens 510 enables the application of the same subject light to a plurality of pixels of the imaging device.

In the configuration illustrated in FIG. 13, the low-resolution imaging lens 510 is a lens with lower resolution than the pixel pitch of the imaging device. In terms of incident light entering via the low-resolution imaging lens 510, it is set in such a manner as that the same subject light is applied to a pixel area of a plurality of pixels, specifically, 2×2 pixels as illustrated in FIG. 13 (a), even in the sharpest focus position.

In this manner, a lens with lower resolution than the pixel pitch is applied. Accordingly, the light from a subject in focus can be diffused over and applied to a plurality of pixels.

The configuration of an imaging device 520 illustrated in FIG. 13 corresponds to a configuration where the microlenses 124 are omitted from the imaging device 120 described above with reference to FIG. 4. In other words, the imaging device 520 has a configuration where a photoelectric conversion element 521, a color filter 522, and an onchip lens 523 are stacked.

The pixel arrangement of the imaging device 520 is the four-way split Bayer arrangement described with reference to FIG. 1(2) as in the first example.

[5. Example Using an Optical Low-pass Filter]

Next, an example where an optical low-pass filter is used is described as a third example of the imaging apparatus of the present disclosure.

In the first example, the configuration is achieved where the same subject light is diffused over and enters a plurality of pixels of the imaging device by use of the microlens 124 as illustrated in FIG. 4.

Moreover, in the above second example, the configuration is achieved where the same subject light is diffused over and enters a plurality of pixels of the imaging device by use of the low-resolution imaging lens 510 as illustrated in FIG. 13.

Figure 14:
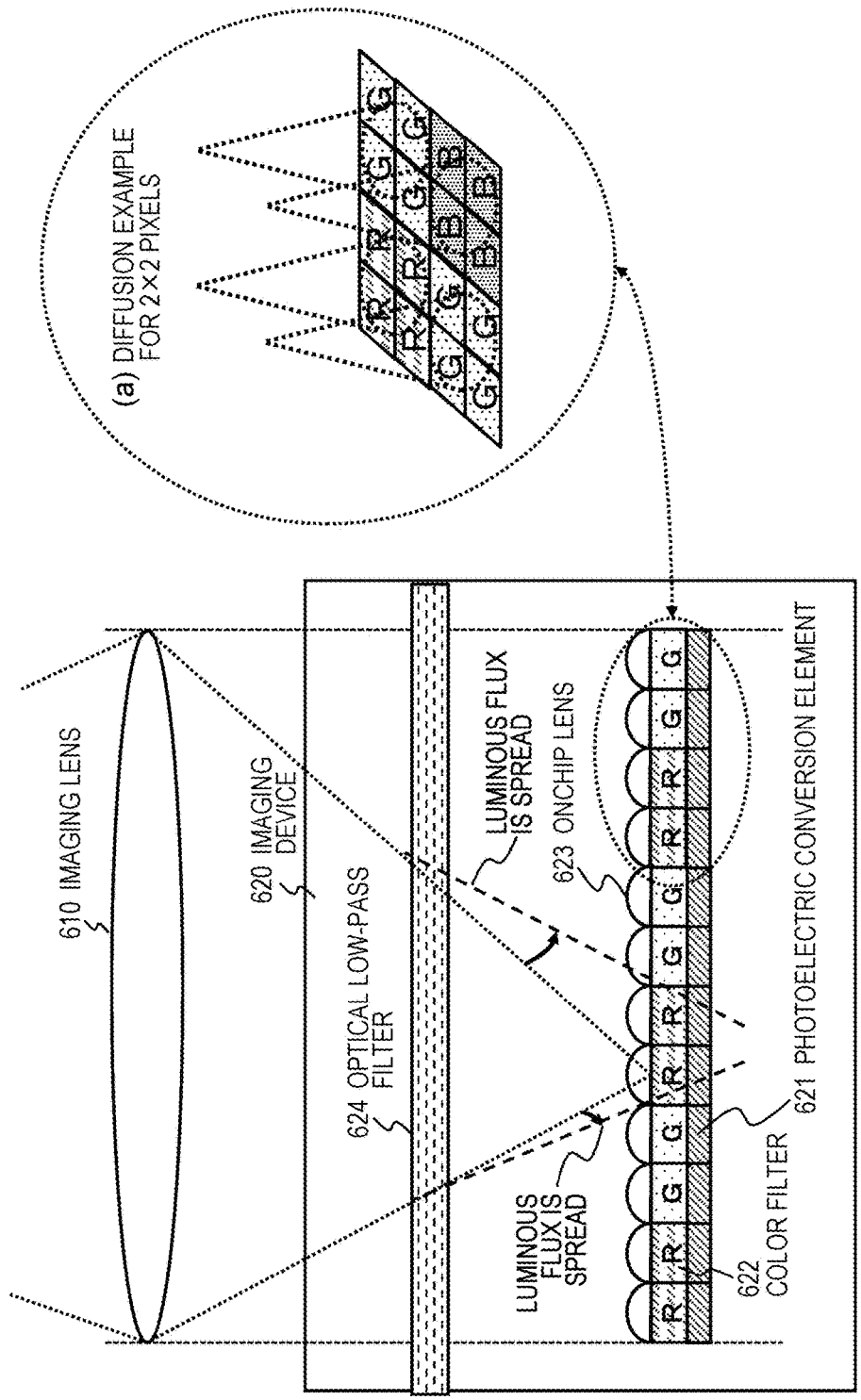
FIG. 14 is a diagram explaining an example of the configuration of the imaging device of the imaging apparatus of the present disclosure.

In addition, in order to achieve a configuration where the same subject light is diffused over and enters a plurality of pixels of the imaging device, it may be configured to place an optical low-pass filter 624 that selectively transmits only a low frequency light between an imaging lens 610 and a photoelectric conversion element 621 as illustrated in FIG. 14.

In the configuration illustrated in FIG. 14, the optical low-pass filter 624 is an optical low-pass filter having a property that does not transmit a predetermined high frequency light from incident light via the imaging lens 610.

The light transmitted through the optical low-pass filter 624 plays a role in spreading, that is, blurring, luminous flux corresponding to the same subject light as illustrated in FIG. 14. As a result, the same subject light is diffused over and enters a plurality of pixels of the imaging device as in the first and second examples described above. Specifically, it is set in such a manner as that the same subject light is applied to a pixel area of 2×2 pixels as illustrated in FIG. 14(*a*).

The configuration of an imaging device 620 illustrated in FIG. 14 corresponds to a configuration where the microlenses 124 in the imaging device 120 described above with reference to FIG. 4 are replaced with the optical low-pass filter 624. The other configurations are similar to those illustrated in FIG. 4. The configuration of the imaging device 620 is a configuration where a photoelectric conversion element 621, a color filter 622, and an onchip lens 623 are stacked and the optical low-pass filter 624 is placed on the imaging lens side.

The arrangement of the pixels of the imaging device 520 is the four-way split Bayer arrangement described with reference to FIG. 1(2) as in the first example.

[6. Variations in the Pixel Arrangement]

In the first example described above, a description has been given of the configuration where the four-way split Bayer RGB arrangement illustrated in FIG. 1(2) is used as the arrangement of the pixels of the imaging device.

The processes of the present disclosure are not limited to the four-way split Bayer RGB arrangement illustrated in FIG. 1(2) and can also be applied to imaging devices of other various pixel arrangements.

It can also be applied to an imaging device having such a four-way split WRGB arrangement configuration as illustrated in FIG. 15(B).

The arrangement illustrated in FIG. 15(B) is an imaging device having the four-way split WRGB arrangement configuration including a White (transparent) pixel that transmits almost all the visible wavelength lights. Also if an imaging device having such a pixel arrangement is used, the defective pixel detection and correction processes in accordance with the above-mentioned examples are feasible.

If the WRGB arrangement illustrated in FIG. 15(B) is used, the arrangement conversion unit 170 of the signal processing unit 130 illustrated in FIG. 7 needs to execute the process of converting the four-way split WRGB arrangement into the Bayer arrangement.

[7. Example in which the Arrangement Conversion Unit is Replaced with the Demosaicing Processing Unit]

The signal processing unit 130 described above with reference to FIG. 7 inputs an image where the pixel values after the defect correction output from the defect detection and correction unit 140 are set, in other words. The defect-corrected four-way split Bayer arrangement image 212 illustrated in FIG. 7, is input into the arrangement conversion unit 170. The arrangement conversion unit 170 is configured to convert the pixel arrangement of the defect-corrected four-way split Bayer arrangement image 212 being the input image, generate the Bayer arrangement image 213, and input the Bayer arrangement image 213 into the camera signal processing unit 180.

In other words, in the above-mentioned first example, the camera signal processing unit 180 is configured to execute the demosaicing process, in other words, the demosaicing process of setting previous RGB pixel values for each pixel based on the Bayer arrangement image 213 where only a pixel value of R, G, or B has been set for each pixel.

Figure 16:
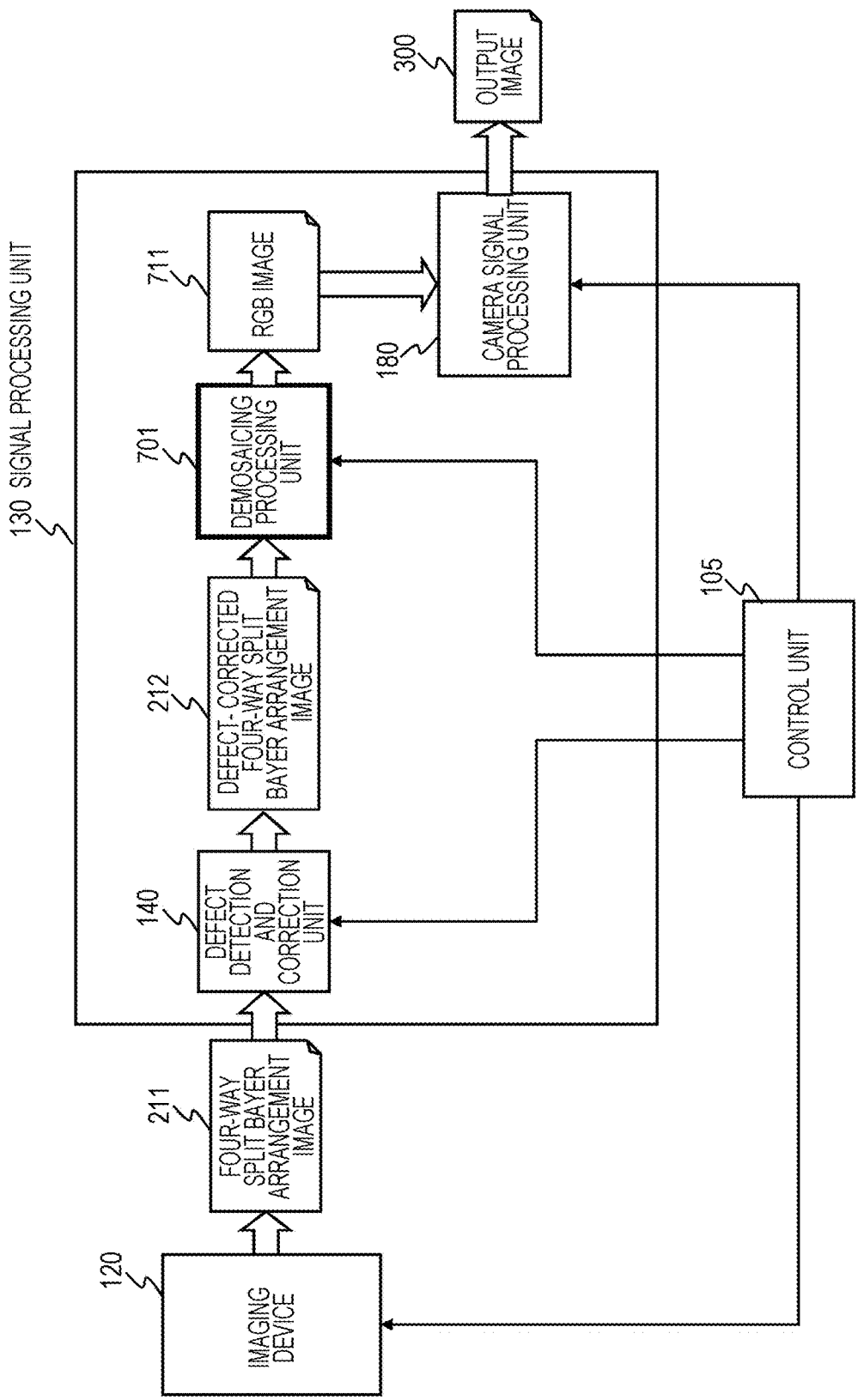
FIG. 16 is a diagram explaining one example of the signal processing unit of the imaging apparatus of the present disclosure.

In contrast, the signal processing unit 130 illustrated in FIG. 16 includes a demosaicing processing unit 701 instead of the arrangement conversion unit 170 illustrated in FIG. 7.

The demosaicing processing unit 701 inputs the defect-corrected four-way split Bayer arrangement image 212 from the defect detection and correction unit 140 into the arrangement conversion unit 170, and executes the demosaicing process of setting all RGB pixels for each pixel of the converted Bayer arrangement image based on the input image in conjunction with the conversion into the Bayer arrangement. An RGB image 711 generated by the demosaicing process is output to the camera signal processing unit 180.

The camera signal processing unit 180 executes other general camera signal processing, for example, processes such as white balance adjustment and gamma correction, without executing the demosaicing process, and generates an output image 300.

[8. Example Including a Specific Point-of-View Image Generation Unit]

Next, an example including a specific point-of-view image generation unit 801 in the signal processing unit 130 is described with reference to FIG. 17.

The first example described above has a configuration where the microlenses 124 are placed on the front side of the imaging device 120 as described with reference to FIG. 4.

The configuration where the placement of the microlens 124 allows the subject light to be diffused over and applied to a plurality of pixels is as described above.

As another action of the microlens 124, there is action that an image from a different point-of-view, or an image with a different focal length, depending on the area of the photoelectric conversion element of the imaging device, can be acquired individually.

For example, an imaging method called "Light Field Photography" is disclosed in the document [Ren. Ng, and 7 others, "Light Field Photography with a Hand-Held Plenoptic Camera", Stanford Tech Report CTSR 2005-02].

The method discloses a configuration where a microlens is placed at the front of the imaging device, and incident light is diffused via the microlens and applied to photoelectric conversion units as in the first example described above. This configuration enables the individual acquisition of an image from a different point-of-view, or an image with a different focal length, depending on the area of the photoelectric conversion element of the imaging device.

In accordance with "Light Field Photography" described in the above document, the configuration to individually acquire an image from a different point-of-view, or an image with a different focal length, depending on the area of the photoelectric conversion element of the imaging device is described with reference to FIG. 18.

Figure 18:
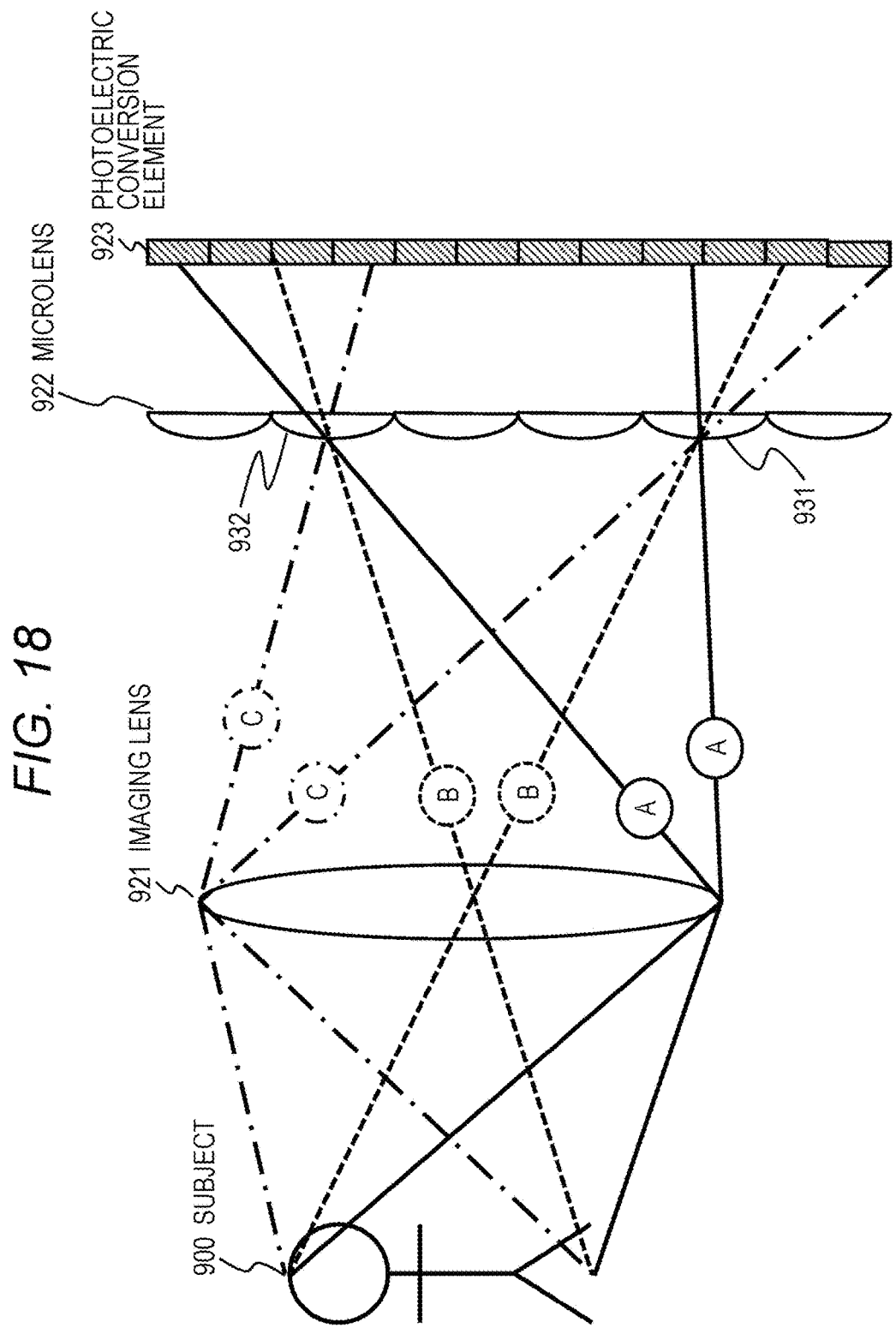
FIG. 18 is a diagram explaining a configuration that individually acquires an image from a different point-of-view, or an image with a different focal length, depending on the area of a photoelectric conversion element of the imaging device.

FIG. 18 illustrates a subject 900 as an image capture target, an imaging lens 921, microlenses 922, and photoelectric conversion elements 923.

Light emitted from a specific position from the head to the toe of the subject 900 passes through the imaging lens 921 as a main lens, and is collected onto one of the microlenses 922. For example, the ray of light emitted from the head of the subject 900 in the figure is collected onto a microlens 931 in the lower part of the imaging device as in the figure, and the ray of light emitted from the toe of the subject 900 is similarly condensed onto a microlens 932 in the upper part.

The lights having passed through the microlenses 922 are applied to pixels of the photoelectric conversion elements 923 in the corresponding patches.

In this manner, it is possible to record the generation position of the ray of light emitted from the subject in the microlens 922, and record the direction of the ray of light in the imaging device. In this manner, the ray of light recorded in each pixel of the photoelectric conversion element 923 is selectively used. Accordingly, a specific focal point image and a specific point-of-view image can be generated.

For example, an image is restored by collecting only the rays of light drawn by solid lines (A) of FIG. 18. Accordingly, an image that the rays of light pass the lower end of the imaging lens 921 can be generated. Moreover, if the rays of light drawn by dotted lines (B) of FIG. 18 are collected, an image that the rays of light have passed through the center of the imaging lens 921 can be obtained. Furthermore, if the rays of light drawn by dot and dash lines (C) of FIG. 18 are collected, an image that the rays of light have passed through the top of the imaging lens 921 can be obtained.

An image having a plurality of points of sight can be generated in one image capture in this manner. Alternatively, an image having a specific blur can be generated by synthesizing the rays of light obtained from different points of sight.

The images captured in such a method are used. The information on the direction and position of the ray of light of the subject corresponding to each pixel of the imaging device is referred to and the images are appropriately combined and reconstructed. Therefore, it becomes possible to generate an image of different points of sight using one captured image. Alternatively, a plurality of images having different focal points can be generated simultaneously.

Figure 17:
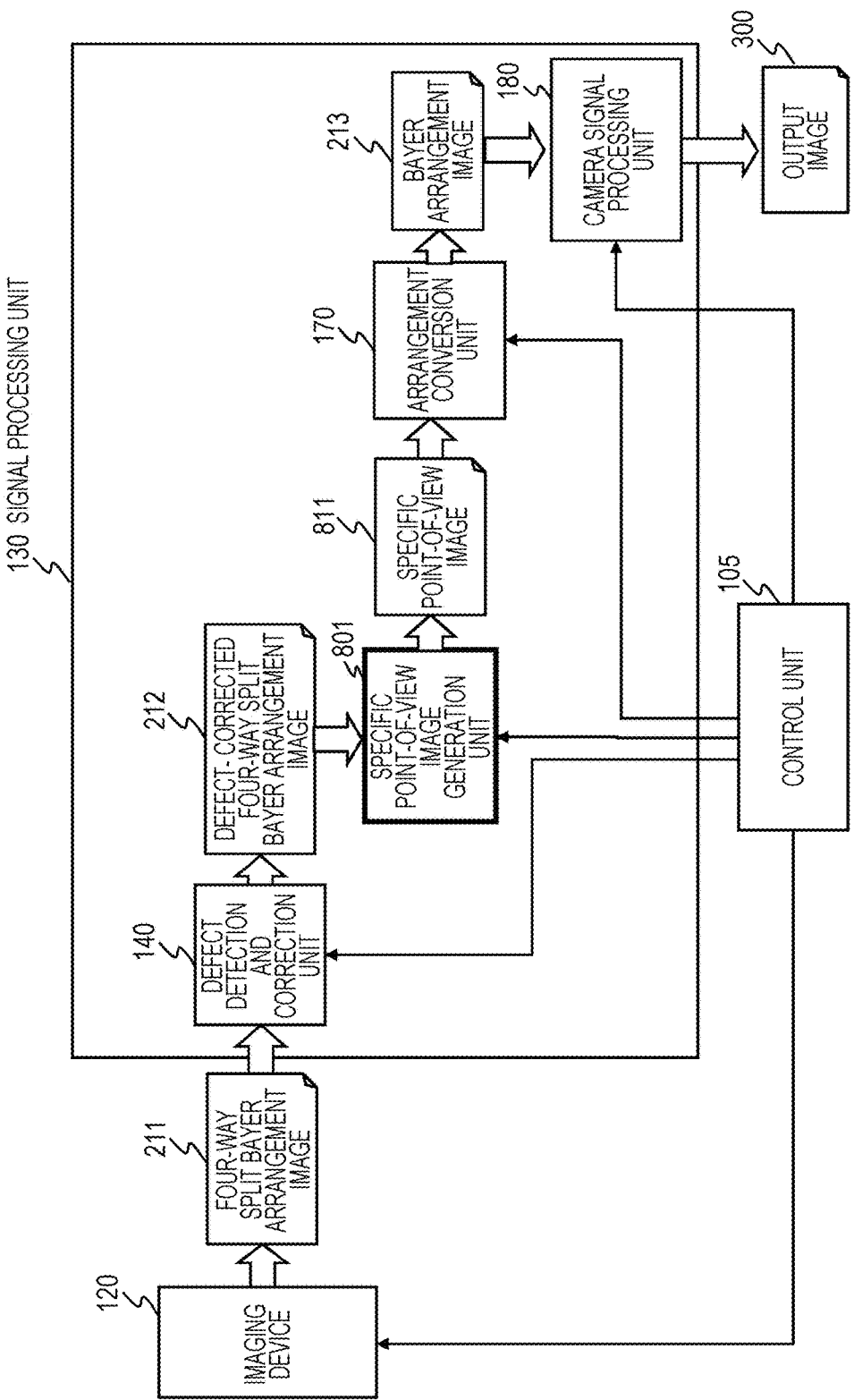
FIG. 17 is a diagram explaining one example of the signal processing unit of the imaging apparatus of the present disclosure.

The specific point-of-view image generation unit 801 in the signal processing unit 130 illustrated in FIG. 17 executes these processes, generates an image of a plurality of different points of sight, or a plurality of images having different focal points as a specific point-of-view image 811, and outputs the specific point-of-view image 811 to the arrangement conversion unit 170.

The specific point-of-view image 811 illustrated in the figure includes one or a plurality of specific point-of-view images.

Here, the specific point-of-view is assumed to include both the point-of-view as an observation position and the position of the subject at a specific focal length.

In this manner, the specific point-of-view image generation unit 801 is set. Accordingly, different specific point-of-view images can be generated simultaneously with the defect correction.

[9. Summary of the Configuration of the Present Disclosure]

Up to this point the examples of the present disclosure have been described in detail with reference to the specific examples. However, it is obvious that those skilled in the art can make modifications to and substitutions of the examples within the range that does not deviate from the gist of the present disclosure. In other words, the present invention has been disclosed by way of illustration. The present invention should not be interpreted restrictively. In order to judge the gist of the present disclosure, the claims should be taken into consideration.

The technology disclosed in the description can take the following configurations:

(1) An imaging apparatus including:
  an imaging device; and
  a signal processing unit for analyzing an output signal from the imaging device and detecting a defective pixel included in the imaging device, wherein
  the imaging device inputs the same subject light on a local area basis including a plurality of pixels of the imaging device, acquires an image signal lower than a pixel resolving power corresponding to the pixel density of the imaging device, and outputs the image signal to the signal processing unit, and
  the signal processing unit compares pixel values of the same color pixels included in the local area on a local area basis including a cluster of the plurality of pixels of the imaging device, and detects a defective pixel based on the comparison result.

(2) The imaging apparatus according to (1), wherein the signal processing unit executes a process of determining a pixel of interest to be a defective pixel when variations in pixel values of the same color pixels included in the local area is large, and when a difference between an average of intermediate pixel values except maximum and minimum pixel values of the same color pixels included in the local area, and a pixel value of the pixel of interest is large.

(3) The imaging apparatus according to (1) or (2), wherein the signal processing unit executes a process of determining a pixel of interest to be a defective pixel when a standard deviation of pixel values of the same color pixels included in the local area is larger than a preset threshold value (TH1), and when a difference absolute value between an average of intermediate pixel values except maximum and minimum pixel values of the same color pixels included in the local area, and a pixel value of the pixel of interest is larger than a preset threshold value (TH2).

(4) The imaging apparatus according to any of (1) to (3), wherein the imaging device includes a photoelectric conversion unit having pixels arranged in a two-dimensional array form, and a microlens placed on an imaging lens side being on a front side of the photoelectric conversion unit, and has a configuration where incident light via an imaging lens is diffused via the microlens, and the same subject light is received on the local area basis including the plurality of pixels of the imaging device.

(5) The imaging apparatus according to (4), wherein the signal processing unit has a configuration where an image on a specific pixel area basis is reconstructed from an image acquired by the imaging device including the microlens and accordingly a specific point-of-view image is generated.

(6) The imaging apparatus according to any of (1) to (5), wherein the imaging device has a pixel arrangement where each pixel of a Bayer arrangement including RGB pixels or an arrangement including RGBW pixels is split into four, 2×2 pixels, of the same color.

(7) The imaging apparatus according to (6), wherein the imaging device inputs the same subject light on a local area basis including 2×2 same color pixels of the imaging device, acquires an image signal lower than a pixel resolving power corresponding to the pixel density of the imaging device, and outputs the image signal to the signal processing unit.

(8) The imaging apparatus according to (6), wherein the imaging device inputs the same subject light on a local area basis including 4×4 or 8×8 pixels of the imaging device, acquires an image signal lower than a pixel resolving power corresponding to the pixel density of the imaging device, and outputs the image signal to the signal processing unit.

(9) The imaging apparatus according to any of (1) to (8), wherein the imaging device lets in subject light via a low-resolution imaging lens with a low optical resolving power for forming an optical image with a resolving power lower than a pixel resolving power corresponding to the pixel density of the imaging device and accordingly acquires an image signal lower than the pixel resolving power corresponding to the pixel density of the imaging device, and outputs the image signal to the signal processing unit.

(10) The imaging apparatus according to any of (1) to (9), wherein the imaging device includes a photoelectric conversion unit having pixels arranged in a two-dimensional array form, and an optical low-pass filter placed on an imaging lens side being on a front side of the photoelectric conversion unit, and has a configuration where incident light via an imaging lens is diffused via the optical low-pass filter, and the same subject light is received on the local area basis including the plurality of pixels of the imaging device.

(11) The imaging apparatus according to any of (1) to (10), wherein the signal processing unit includes a defective pixel correction unit for executing a pixel value correction on a defective pixel, and the defective pixel correction unit calculates a corrected pixel value of the defective pixel taking, as reference pixels, intermediate pixel values except maximum and minimum pixel values of the pixels of the same color as the defective pixel included in the same local area as the defective pixel.

(12) The imaging apparatus according to (11), wherein the defective pixel correction unit sets a maximum pixel value of the intermediate pixel values as the corrected pixel value of the defective pixel when the defective pixel has the maximum pixel value among the same color pixels in the local area including the defective pixel, and sets a minimum pixel value of the intermediate pixel values as the corrected pixel value of the defective pixel when the defective pixel has the minimum pixel value among the same color pixels in the local area including the defective pixel.

(13) An image processing method executed in an imaging apparatus, executing:
a step of, in an imaging device, inputting the same subject light on a local area basis including a plurality of pixels of the imaging device, acquiring an image signal lower than a pixel resolving power corresponding to the pixel density of the imaging device, and outputting the image signal to the signal processing unit, and
a signal processing step of, in the signal processing unit, analyzing an output signal from the imaging device, and detecting a defective pixel included in the imaging device, wherein
in the signal processing step, the signal processing unit compares pixel values of the same color pixels included in the local area on a local area basis including a cluster of the plurality of pixels of the imaging device, and detects the defective pixel based on the comparison result.

(14) A program to cause an imaging apparatus to execute image processing, including:
a step of causing an imaging device to input the same subject light on a local area basis including a plurality of pixels of the imaging device, acquire an image signal lower than a pixel resolving power corresponding to the pixel density of the imaging device, and output the image signal to the signal processing unit, and
a signal processing step of causing the signal processing unit to analyze an output signal from the imaging device, and detect a defective pixel included in the imaging device, wherein
the signal processing step includes comparing pixel values of the same color pixels included in the local area on a local area basis including a cluster of the plurality of pixels of the imaging device, and detecting the defective pixel based on the comparison result.

Moreover, a series of processes described in the description can be executed by hardware, software, or a configuration of their combination. In a case of executing the processes by software, a program in which the process sequence is recorded can be installed in memory in a computer integrated in dedicated hardware, and executed, or installed in a general purpose computer capable of executing various processes, and executed. For example, the program can be prerecorded in a recording medium. In addition to installation from a recording medium to a computer, the program can be installed in a built-in recording medium such as a hard disk by being received via a network such as a LAN (Local Area Network) or the Internet.

Various processes described in the description are not only executed in chronological order in accordance with the description, but can be executed in parallel or individually in accordance with the processing capacity of a device that executes the processes, or as needed. Moreover, the system in the description is a logically assembled configuration of a plurality of devices, and is not limited to one having devices of configurations in the same housing.

INDUSTRIAL APPLICABILITY

As described above, according to the configuration of one example of the present disclosure, a defective pixel of an imaging device is detected. An output pixel value of the defective pixel is corrected to generate an output image.

Specifically, an imaging apparatus includes an imaging device, and a signal processing unit that analyzes an output signal from the imaging device and detects a defective pixel. The imaging device receives incident light via, for example, a microlens placed in front of a pixel, inputs the same subject light on a local area basis including a plurality of pixels of the imaging device, and acquires an image signal lower than a pixel resolving power corresponding to the pixel density of the imaging device. The signal processing unit compares the pixel values of the same color pixels included in the local area on a local area basis including a cluster of a plurality of pixels of the imaging device, detects a defective pixel based on the comparison result, and corrects and outputs a pixel value of a pixel determined to be a defective pixel.

These processes enable highly accurate detection of a defective pixel existing in the imaging device. Accordingly, it is possible to generate a high quality output image where the output pixel value of the defective pixel has been corrected.

REFERENCE SIGNS LIST

110 Imaging lens
120 Imaging device
121 Photoelectrical conversion element

122 Color filter
123 Onchip lens
124 Microlens
130 Signal processing unit
135 Control unit
140 Defect detection and correction unit
141 Local area extraction unit
150 Defective pixel detection unit
151 Maximum/minimum pixel value detection unit
152 Standard deviation (std) calculation unit
153 Intermediate pixel average (T) calculation unit
154 Defective pixel determination unit
160 Defective pixel correction unit
161 Intermediate pixel detection unit
162 Pixel value correction unit
510 Low-resolution imaging lens
520 Imaging device
521 Photoelectric conversion element
522 Color filter
523 Onchip lens
610 Imaging lens
620 Imaging device
621 Photoelectric conversion element
622 Color filter
623 Onchip lens
624 Optical low-pass filter
701 Demosaicing processing unit
801 Specific point-of-view image generation unit
900 Subject
921 Imaging lens
922 Microlens
923 Photoelectric conversion element

The invention claimed is:

1. An imaging apparatus, comprising:
an image sensor including a plurality of pixels;
a low-resolution imaging lens having a resolution lower than a pixel pitch of the image sensor, wherein the low-resolution imaging lens is configured to focus a same subject light on the image sensor on a local area basis; and
signal processing circuitry configured to analyze an output signal from the image sensor and detect a defective pixel included in the image sensor, wherein:
the image sensor is configured to form, based on the same subject light focused by the low-resolution imaging lens on the image sensor on the local area basis, an optical image with a resolving power lower than a pixel resolving power corresponding to a pixel density of the image sensor and accordingly acquire an image signal having lower resolution than the pixel resolving power corresponding to the pixel density of the image sensor, and output the image signal to the signal processing circuitry, and
the signal processing circuitry is configured to:
process the image signal by comparing pixel values of same color pixels included in a local area on the local area basis, the local area corresponding to a cluster of the plurality of pixels of the image sensor; and
detect the defective pixel based on a result of the comparison.

2. The imaging apparatus according to claim 1, wherein the signal processing circuitry is further configured to execute a process of determining a pixel of interest to be the defective pixel
when variations in the pixel values of the same color pixels included in the local area is large, and
when a difference between an average of intermediate pixel values except maximum and minimum pixel values of the same color pixels included in the local area, and a pixel value of the pixel of interest is large.

3. The imaging apparatus according to claim 1, wherein the signal processing circuitry is further configured to execute a process of determining a pixel of interest to be the defective pixel
when a standard deviation of the pixel values of the same color pixels included in the local area is larger than a preset threshold value (TH1), and
when a difference absolute value between an average of intermediate pixel values except maximum and minimum pixel values of the same color pixels included in the local area, and a pixel value of the pixel of interest is larger than a preset threshold value (TH2).

4. The imaging apparatus according to claim 1, wherein the image sensor
includes a photoelectric conversion unit having pixels arranged in a two-dimensional array form, and a microlens placed on an imaging lens side being on a front side of the photoelectric conversion unit, and
has a configuration where incident light via an imaging lens is diffused via the microlens, and the same subject light is received on the local area basis including the plurality of pixels of the image sensor.

5. The imaging apparatus according to claim 4, wherein the signal processing circuitry has a configuration where an image on a specific pixel area basis is reconstructed from an image acquired by the image sensor including the microlens and accordingly a specific point-of-view image is generated.

6. The imaging apparatus according to claim 1, wherein the image sensor has a pixel arrangement where each pixel of a Bayer arrangement including RGB pixels or an arrangement including RGBW pixels is split into four, 2×2 pixels, of the same color.

7. The imaging apparatus according to claim 6, wherein the image sensor is further configured to input the same subject light on the local area basis including 2×2 same color pixels of the image sensor, acquire the image signal having lower resolution than the pixel resolving power corresponding to the pixel density of the image sensor, and output the image signal to the signal processing circuitry.

8. The imaging apparatus according to claim 6, wherein the image sensor is further configured to input the same subject light on the local area basis including 4×4 or 8×8 pixels of the image sensor, acquire the image signal having lower resolution than the pixel resolving power corresponding to the pixel density of the image sensor, and output the image signal to the signal processing circuitry.

9. The imaging apparatus according to claim 1, wherein the image sensor
includes a photoelectric conversion unit having pixels arranged in a two-dimensional array form, and an optical low-pass filter placed on an imaging lens side being on a front side of the photoelectric conversion unit, and
has a configuration where incident light via an imaging lens is diffused via the optical low-pass filter, and the same subject light is received on the local area basis including the plurality of pixels of the image sensor.

10. The imaging apparatus according to claim 1, wherein the signal processing circuitry is further configured to execute a pixel value correction on the defective pixel, and calculate a corrected pixel value of the defective pixel taking, as reference pixels, intermediate pixel values except maximum and minimum pixel values of the pixels of the same color as the defective pixel included in the same local area as the defective pixel.

11. The imaging apparatus according to claim 10, wherein the signal processing circuitry is further configured to
set a maximum pixel value of the intermediate pixel values as the corrected pixel value of the defective pixel when the defective pixel has the maximum pixel value among the same color pixels in the local area including the defective pixel, and
set a minimum pixel value of the intermediate pixel values as the corrected pixel value of the defective pixel when the defective pixel has the minimum pixel value among the same color pixels in the local area including the defective pixel.

12. An imaging apparatus, comprising:
an image sensor; and
signal processing circuitry configured to analyze an output signal from the image sensor and detect a defective pixel included in the image sensor, wherein:
the image sensor is configured to input a same subject light on a local area basis including a plurality of pixels of the image sensor, acquire an image signal lower than a pixel resolving power corresponding to a pixel density of the image sensor, and output the image signal to the signal processing circuitry,
the signal processing circuitry is configured to compare pixel values of same color pixels included in a local area on the local area basis including a cluster of the plurality of pixels of the image sensor, and detect a defective pixel based on the comparison result, and
the signal processing circuitry is further configured to operate as a defective pixel correction unit for executing a pixel value correction on the defective pixel, wherein the defective pixel correction unit
calculates a corrected pixel value of the defective pixel taking, as reference pixels, intermediate pixel values except maximum and minimum pixel values of the pixels of the same color as the defective pixel included in the same local area as the defective pixel,
sets a maximum pixel value of the intermediate pixel values as the corrected pixel value of the defective pixel when the defective pixel has the maximum pixel value among the same color pixels in the local area including the defective pixel, and
sets a minimum pixel value of the intermediate pixel values as the corrected pixel value of the defective pixel when the defective pixel has the minimum pixel value among the same color pixels in the local area including the defective pixel.

13. The imaging apparatus according to claim 12, wherein the signal processing circuitry is further configured to execute a process of determining a pixel of interest to be the defective pixel
when variations in the pixel values of the same color pixels included in the local area is large, and
when a difference between an average of the intermediate pixel values except the maximum and minimum pixel values of the same color pixels included in the local area, and a pixel value of the pixel of interest is large.

14. The imaging apparatus according to claim 12, wherein the signal processing circuitry is further configured to execute a process of determining a pixel of interest to be the defective pixel
when a standard deviation of the pixel values of the same color pixels included in the local area is larger than a preset threshold value (TH1), and
when a difference absolute value between an average of the intermediate pixel values except the maximum and minimum pixel values of the same color pixels included in the local area, and a pixel value of the pixel of interest is larger than a preset threshold value (TH2).

15. The imaging apparatus according to claim 12, wherein the image sensor
includes a photoelectric conversion unit having pixels arranged in a two-dimensional array form, and a microlens placed on an imaging lens side being on a front side of the photoelectric conversion unit, and
has a configuration where incident light via an imaging lens is diffused via the microlens, and the same subject light is received on the local area basis including the plurality of pixels of the image sensor.

16. The imaging apparatus according to claim 15, wherein the signal processing circuitry has a configuration where an image on a specific pixel area basis is reconstructed from an image acquired by the image sensor including the microlens and accordingly a specific point-of-view image is generated.

17. The imaging apparatus according to claim 12, wherein the image sensor has a pixel arrangement where each pixel of a Bayer arrangement including RGB pixels or an arrangement including RGBW pixels is split into four, 2×2 pixels, of the same color.

18. The imaging apparatus according to claim 17, wherein the image sensor is further configured to input the same subject light on the local area basis including 2×2 same color pixels of the image sensor, acquire the image signal having lower resolution than the pixel resolving power corresponding to the pixel density of the image sensor, and output the image signal to the signal processing circuitry.

19. The imaging apparatus according to claim 17, wherein the image sensor is further configured to input the same subject light on the local area basis including 4×4 or 8×8 pixels of the image sensor, acquire the image signal having lower resolution than the pixel resolving power corresponding to the pixel density of the image sensor, and output the image signal to the signal processing circuitry.

20. The imaging apparatus according to claim 12, wherein the image sensor
includes a photoelectric conversion unit having pixels arranged in a two-dimensional array form, and an optical low-pass filter placed on an imaging lens side being on a front side of the photoelectric conversion unit, and
has a configuration where incident light via an imaging lens is diffused via the optical low-pass filter, and the same subject light is received on the local area basis including the plurality of pixels of the image sensor.

* * * * *